(12) United States Patent
Maimon

(10) Patent No.: US 11,245,048 B2
(45) Date of Patent: *Feb. 8, 2022

(54) REDUCED DARK CURRENT PHOTODETECTOR WITH CHARGE COMPENSATED BARRIER LAYER

(71) Applicant: Shimon Maimon, Rochester, NY (US)

(72) Inventor: Shimon Maimon, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/199,212

(22) Filed: Nov. 25, 2018

(65) Prior Publication Data

US 2019/0115490 A1 Apr. 18, 2019

Related U.S. Application Data

(60) Division of application No. 15/679,487, filed on Aug. 17, 2017, which is a continuation-in-part of
(Continued)

(51) Int. Cl.
*H01L 31/18* (2006.01)
*H01L 31/0296* (2006.01)
(Continued)

(52) U.S. Cl.
CPC .......... *H01L 31/1832* (2013.01); *B82Y 20/00* (2013.01); *G01J 5/061* (2013.01);
(Continued)

(58) Field of Classification Search
CPC ........... H01L 31/1832; H01L 27/14669; H01L 31/02966; H01L 31/03046;
(Continued)

(56) References Cited

U.S. PATENT DOCUMENTS 4,652,335 A 3/1987 Decoster et al.
4,679,063 A 7/1987 White
(Continued)

FOREIGN PATENT DOCUMENTS

GB 2127619 4/1984

OTHER PUBLICATIONS

"NBn detector, an infrared detector with reduced dark current and higher operating temperature", S. Maimon nad G.W. Wicks, Applied Physics Letters 89, 151109 (2006).
(Continued)

*Primary Examiner* — Mark R Gaworecki
(74) *Attorney, Agent, or Firm* — Shalom Wertsberger; Saltamar Innovations

(57) ABSTRACT

A photodetector comprising a photoabsorber, comprising a doped semiconductor, a contact layer comprising a doped semiconductor and a barrier layer comprising a charge carrier compensated semiconductor, the barrier layer compensated by doping impurities such that it exhibits a valence band energy level substantially equal to the valence band energy level of the photo absorbing layer and a conduction band energy level exhibiting a significant band gap in relation to the conduction band of the photo absorbing layer, the barrier layer disposed between the photoabsorber and contact layers. The relationship between the photo absorbing layer and contact layer valence and conduction band energies and the barrier layer conduction and valance band energies is selected to facilitate minority carrier current flow while inhibiting majority carrier current flow between the contact and photo absorbing layers.

4 Claims, 13 Drawing Sheets

Related U.S. Application Data application No. 14/822,433, filed on Aug. 10, 2015, now Pat. No. 9,766,130, which is a continuation-in-part of application No. 13/964,883, filed on Aug. 12, 2013, now Pat. No. 9,117,726, which is a continuation-in-part of application No. 13/167,992, filed on Jun. 24, 2011, now abandoned, which is a continuation of application No. 12/656,739, filed on Feb. 16, 2010, now Pat. No. 8,003,434, which is a division of application No. 11/276,962, filed on Mar. 19, 2006, now Pat. No. 7,687,871.

(51) Int. Cl.
| | |
|---|---|
| *H01L 31/10* | (2006.01) |
| *G01J 5/06* | (2006.01) |
| *G01J 5/20* | (2006.01) |
| *H01L 27/146* | (2006.01) |
| *H01L 31/101* | (2006.01) |
| *B82Y 20/00* | (2011.01) |
| *H01L 31/0352* | (2006.01) |
| *H01L 31/0304* | (2006.01) |
| *H01L 23/38* | (2006.01) |
| *G01J 5/00* | (2006.01) |

(52) U.S. Cl.
CPC .......... *G01J 5/20* (2013.01); *H01L 27/14669* (2013.01); *H01L 31/02966* (2013.01); *H01L 31/03046* (2013.01); *H01L 31/035236* (2013.01); *H01L 31/101* (2013.01); *H01L 31/1844* (2013.01); *G01J 2005/0077* (2013.01); *H01L 23/38* (2013.01); *H01L 2924/0002* (2013.01); *Y02E 10/544* (2013.01)

(58) Field of Classification Search
CPC ........... H01L 31/035236; H01L 31/101; H01L 31/1844; H01L 23/38; H01L 2924/0002; H01L 31/0002; B82Y 20/00; G01J 5/061; G01J 5/20; G01J 2005/0077; Y02E 10/544
USPC ...................................................... 250/338.4
See application file for complete search history.

(56) References Cited

U.S. PATENT DOCUMENTS

| | | | |
|---|---|---|---|
| 4,682,196 A | 7/1987 | Sakai et al. | |
| 4,731,640 A | 3/1988 | Bluzer | |
| 5,047,622 A | 10/1991 | Chu | |
| 5,177,364 A * | 1/1993 | Gowlett | H01L 31/024 250/352 |
| 5,272,535 A * | 12/1993 | Elabd | H04N 5/14 348/314 |
| 5,563,423 A * | 10/1996 | Wu | B82Y 20/00 257/17 |
| 5,844,253 A * | 12/1998 | Kim | B82Y 10/00 257/24 |
| 5,966,945 A * | 10/1999 | Mengel | G01J 5/061 250/352 |
| 6,380,604 B1 | 4/2002 | Shima | |
| 6,531,721 B1 | 3/2003 | Burton et al. | |
| 6,740,908 B1 | 5/2004 | Giboney | |
| 6,965,152 B1 * | 11/2005 | Bandara | B82Y 20/00 257/431 |
| 7,157,706 B2 * | 1/2007 | Gat | G01J 5/06 250/338.1 |
| 7,180,066 B2 | 2/2007 | Qiu | |
| 7,385,704 B2 | 6/2008 | Mestha et al. | |
| 7,470,904 B1 * | 12/2008 | Schweikert | G01J 5/04 250/338.1 |
| 7,521,737 B2 | 4/2009 | Augusto | |
| 7,531,440 B2 | 5/2009 | Ukai | |
| 7,687,871 B2 | 3/2010 | Maimon | |
| 7,795,640 B2 * | 9/2010 | Klipstein | H01L 31/101 257/188 |
| 8,003,434 B2 | 8/2011 | Maimon | |
| 8,674,406 B2 | 3/2014 | Scott | |
| 9,117,726 B2 | 8/2015 | Maimon | |
| 9,647,155 B1 * | 5/2017 | Maimon | H01L 31/035236 |
| 2002/0070389 A1 | 6/2002 | Song | |
| 2006/0266998 A1 * | 11/2006 | Vega | H01L 31/035236 257/21 |
| 2006/0267007 A1 | 11/2006 | Salzman et al. | |
| 2007/0215858 A1 * | 9/2007 | Uchiyama | H01L 31/022408 257/17 |
| 2007/0235758 A1 * | 10/2007 | Klipstein | H01L 31/101 257/188 |
| 2008/0308840 A1 * | 12/2008 | Ogura | H01L 31/10 257/185 |
| 2010/0155777 A1 | 6/2010 | Cory et al. | |
| 2012/0105646 A1 * | 5/2012 | Oster | G01J 5/08 348/164 |
| 2012/0145996 A1 * | 6/2012 | Ting | H01L 31/101 257/21 |
| 2013/0153769 A1 * | 6/2013 | Singer | G01J 5/0809 250/338.1 |
| 2013/0240835 A1 * | 9/2013 | Takahashi | H01L 31/035236 257/15 |
| 2013/0270517 A1 * | 10/2013 | Nozawa | H01L 33/04 257/13 |

OTHER PUBLICATIONS

"Effects of AlSB interfaces on INAS/INASSb type II infrared superlattice material properties", Steenbergen, Lin, Elhamri, Mitchel, Zhang and Kaspi, Infrared Technology and Applications XLI, edited by Bjørn F. Andresen, Gabor F. Fulop, Charles M. Hanson, Paul R. Norton, Proc. of SPIE vol. 9451, 945114—© 2015 SPIE—CCC code: 0277-786X—doi: 10.1117/12.2177696 (Jun. 22, 2015).

* cited by examiner

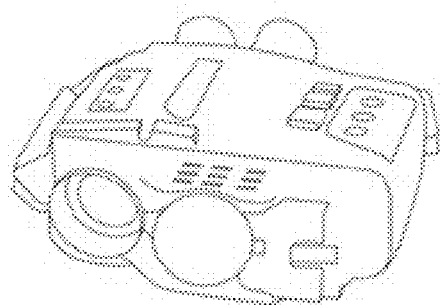
Figure 5A - Prior Art
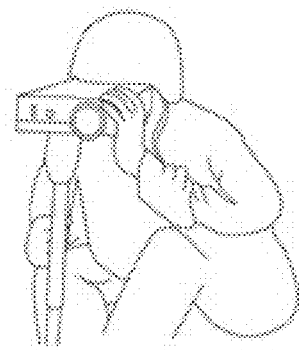
Figure 5B - Prior Art
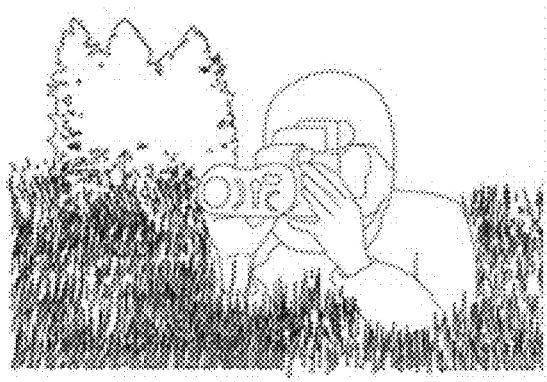
Figure 5C - Prior Art
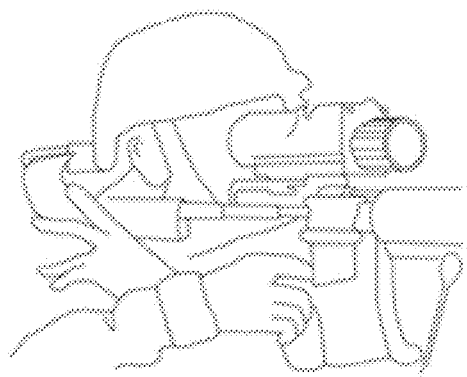
Figure 5D - Prior Art
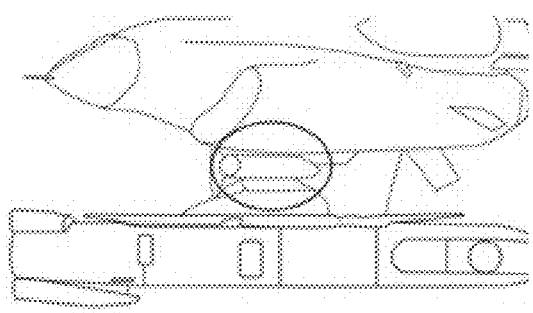
Figure 5E - Prior Art
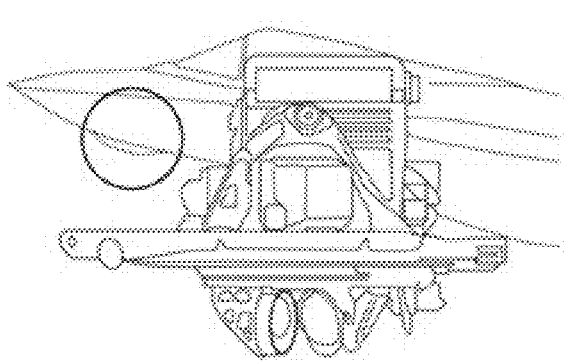
Figure 5F - Prior Art

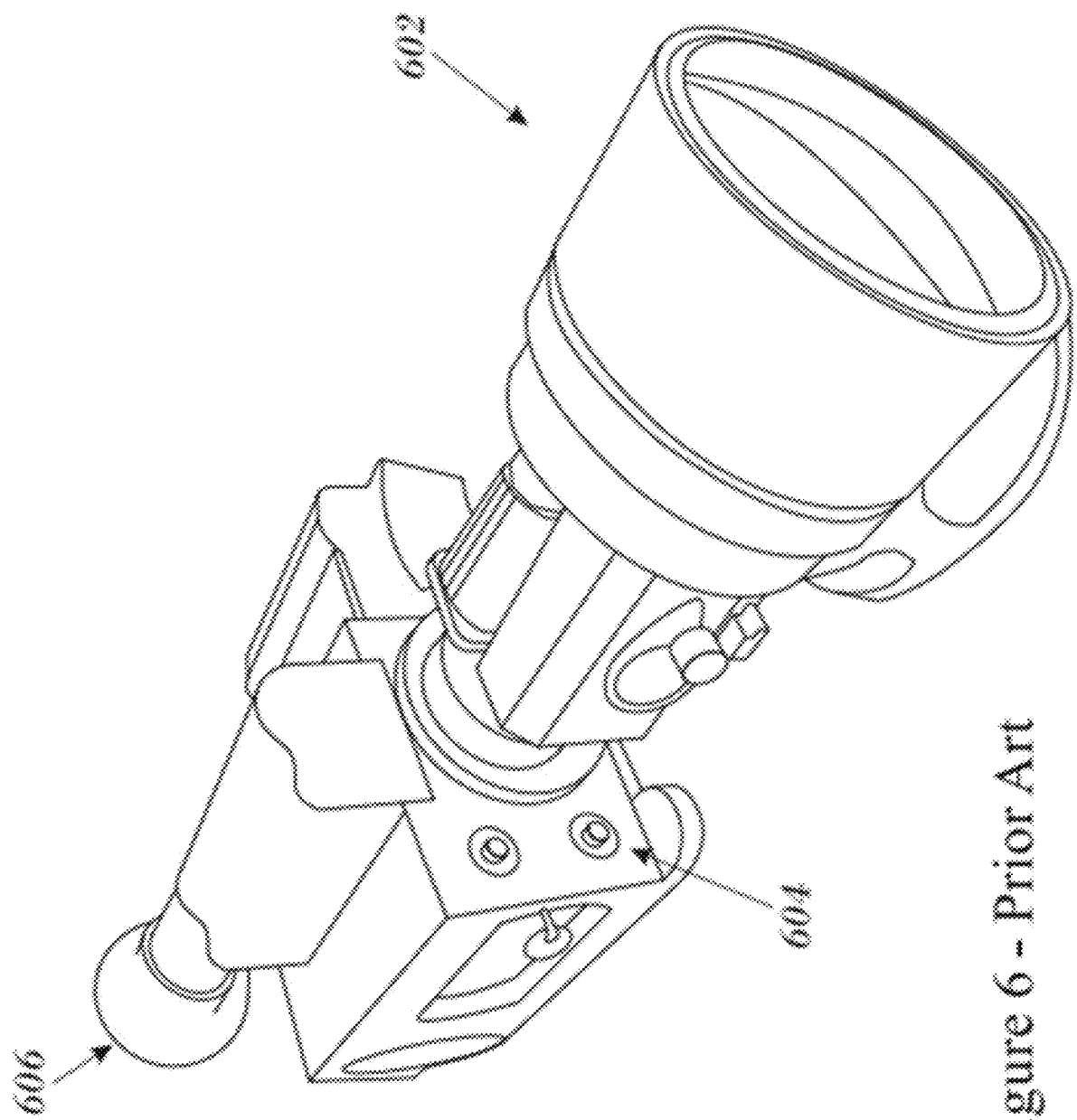
Figure 6 – Prior Art

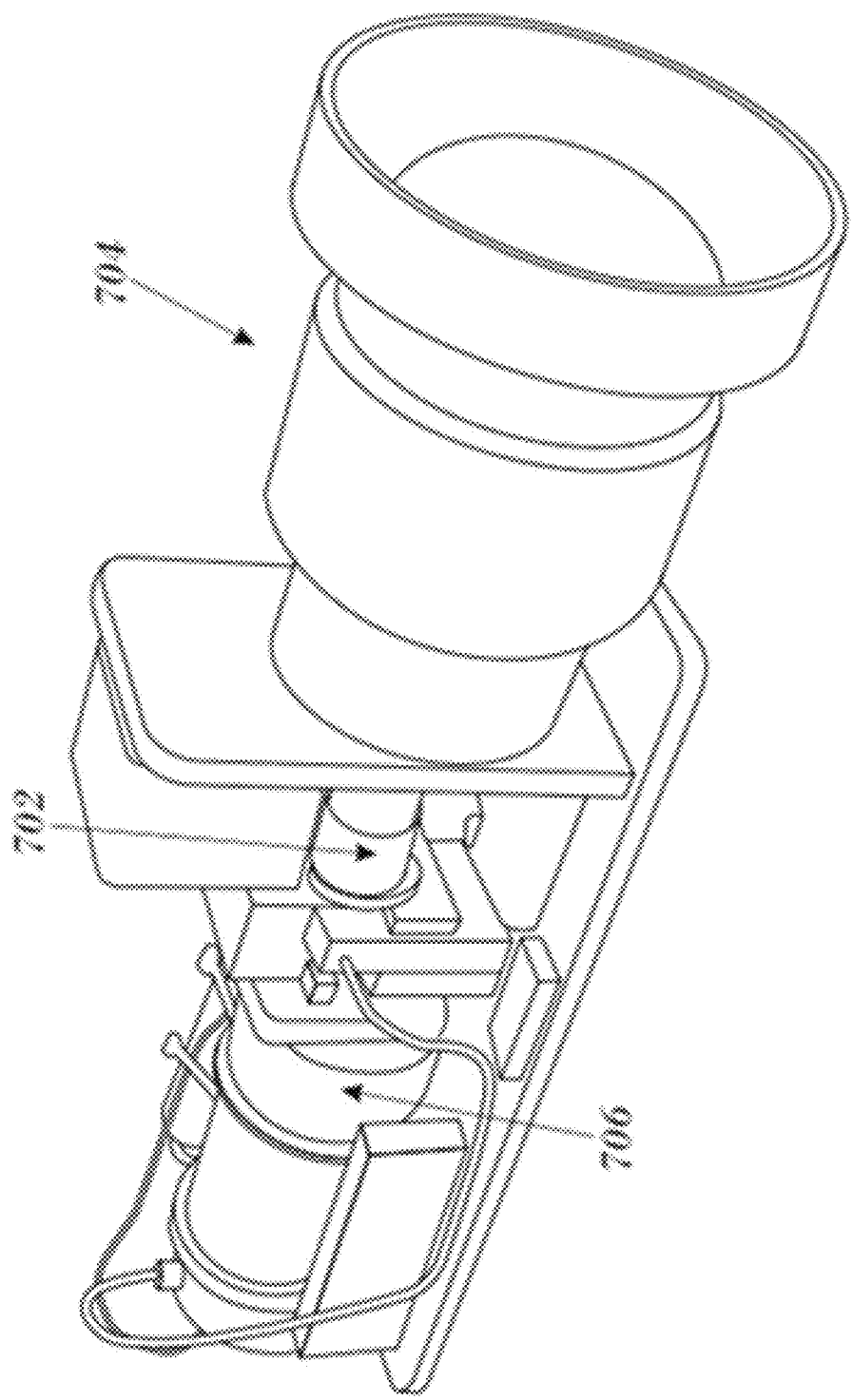
Figure 7 - Prior Art

REDUCED DARK CURRENT PHOTODETECTOR WITH CHARGE COMPENSATED BARRIER LAYER

The present application is a division of U.S. application Ser. No. 15/679,487 filed on Aug. 17, 2017, which is in turn a Continuation in Parts of U.S. application Ser. No. 14/822,433 filed on Aug. 10, 2015 and issued on Sep. 19, 2017 as U.S. Pat. No. 9,766,130 (presently re-issued as U.S. Pat. No. RE 48,693, issued Aug. 17, 2021); which is in turn a Continuation in Parts of U.S. application Ser. No. 13/964,883 which was filed on Aug. 12, 2013 and issued on Aug. 25, 2015 as U.S. Pat. No. 9,117,726 (presently re-issued as U.S. Pat. No. RE 48,642 on Jul. 13, 2021); which is in turn continuation in parts of U.S. application Ser. No. 13/167,992, now abandoned; which is in turn a continuation of U.S. application Ser. No. 12/656,739 which was filed on Feb. 16, 2010 and issued on Aug. 23, 2011 as U.S. Pat. No. 8,003,434; which is in turn a division of U.S. application Ser. No. 11/276,962 which was filed on Mar. 19, 2006 and issued on Mar. 30, 2011 as U.S. Pat. No. 7,687,871.

FIELD OF THE INVENTION

The invention relates generally to the field of semiconductor based photo-detectors and in particular to a photo-detector exhibiting a barrier region between an active semiconductor region and a contact semiconductor region.

BACKGROUND OF THE INVENTION

Photo-detectors are used in a wide variety of applications including imaging. A specific type of photo-detector sensitive to the infra-red wavelengths of light is also known as an infra-red detector. Infra-red covers a broad range of wavelengths, and many materials are only sensitive to a certain range of wavelengths. As a result, the infra-red band is further divided into sub-bands such as near infra-red defined conventionally as 0.75-1.4 µm; short wavelength infra-red defined conventionally as 1.3-3 µm; mid wavelength infra-red defined conventionally as 3-8 µm; and far infra-red defined conventionally as 15-1,000 µm. Infra-red in the range of 5 µm to 8 µm is not well transmitted in the atmosphere and thus for many infra-red detection applications mid-wavelength infra-red is referred to as 3-5 µm.

Infra-red detectors are used in a wide variety of applications, and are particularly in wide use in the military field where they are used as thermal detectors in night vision equipment, air borne systems, naval systems and missile systems. Highly accurate thermal detectors have been produced using InSb and HgCdTe p-n junction diodes, however these thermal detectors require cooling to cryogenic temperatures of around 77 K which is costly. Examples of these existing technologies are presented in FIG. 5A to FIG. 5F. The cryogenic temperatures primarily are used to reduce the dark current generated in the p-n junction diode by among other effects Shockley Reed Hall (SRH) generation.

There are three main contributions to the dark current, denoted as $I_{dark}$, of photodiodes based on narrow band gap semiconductors. The fluctuations of the dark current components are a major factor in the noise that limits the device performance. These components are:
a) a generation current associated with the Shockley-Reed-Hall (SRH) process in the depletion region, $I_{srh}$;
b) a diffusion current associated with auger or radiative processes in the extrinsic area, $I_{diff}$; and
c) a surface current associated with the surface states in the junction, $I_{surf}$. The surface current depends primarily on the passivation process done for the device.

Thus, $I_{dark}$ can be expressed as:

$$I_{dark} = I_{srh} + I_{diff} + I_{surf} \qquad \text{Equation 1}$$

The SRH generation process is very efficient in the depletion region of photodiodes where the mid-gap traps are highly activated. It is the main source of the dark current in photodiodes operable for mid-wavelength infrared at temperatures below 200K. The current associated with this source is:

$$J_{SRH} \approx q \frac{n_i}{\tau_{SRH}} W_{dep} \qquad \text{Equation 2}$$

where $n_i$ is the intrinsic concentration of the semiconductor, $W_{dep}$ is the depletion width (typically in the range of 1 µm), and $T_{SRH}$ is the SRH lifetime of minority carriers in the extrinsic area. The SRH lifetime of minority carriers in the extrinsic area depends on the quality of the material, i.e. the trap concentration, and is typically in the range of ~1 µsec in low doped material (~$10^{16}$ cm$^{-3}$).

The dependence of SRH current on $n_i$ produces an activation energy of $$E_g/2 \left( n_i \sim \exp\left(-\frac{E_g}{2kT}\right) \right),$$

because the source of this generation process is through mid-gap traps. A secondary source of dark current in photodiodes is thermal generation in the neutral regions and diffusion to the other side of the junction. This thermal generation current depends on the auger or radiative process in this area, and is expressed as:

$$J_{diff} \approx qp_n \times \frac{1}{\tau_{diff}} \times L = q \times \frac{n_i^2}{N_d} \times \frac{1}{\tau_{diff}} \times L \qquad \text{Equation 3}$$

where $T_{diff}$ is the lifetime, and in an n-type material exhibiting a doping concentration, denoted $N_d$, of ~$1$-$2 \cdot 10^{16}$ cm$^{-3}$ is in the range of ~0.5 µsec, depending only slightly on temperature. L is the width of the neutral region of the device or the diffusion length of minority carriers (the smaller of the two) and $p_n$ is the hole concentration in the active n type semiconductor in equilibrium and it equal to $n_i^2/N_d$. The activation energy of the diffusion current is $$E_g, \left( n_i^2 \sim \exp\left(-\frac{E_g}{kT}\right) \right)$$

as the process involves band to band excitation.

Additionally, p-n junction diodes, and particularly those produced for thermal imaging require a passivation layer in the metallurgic junction between the p and n layers. Unfortunately this is often difficult to achieve and significantly adds to the cost of production.

U.S. Pat. No. 7,687,871 to the present inventor, from which these specifications claim priority, disclosed a reduced dark photodetector having a photoabsorber, an undoped barrier layer, and a contact layer. In a perfectly undoped barrier layer little or no bias voltage is required to operate the photodetector which further reduces electrical noise levels during operation.

Contamination is a constant problem in the manufacture of semiconductor devices, and even more so in the production of photodetectors which is expensive and consumes many complex resources. Thus any system which may reduce such expenses and allow usage of simpler techniques provide significant advantages and is highly thought after. Contaminated device often present undesired characteristics and behaviors.

There is thus a long felt need for a thermal imaging device that uses a photo-detector with reduced dark noise. Preferably the photo-detector would be sensitive to the mid wavelength infra-red band and not require expensive passivation in production. Further preferably the photo-detector would be operable at significantly higher temperatures than 77K. Further preferably the thermal imaging device would be able to operate for longer periods, be lighter and require less power, when compared to the existing technology in the art. There is a further ongoing need to mitigate the costs or performance issues stemming from contamination during manufacturing of such devices.

SUMMARY OF THE INVENTION

Accordingly, it is a principal object of the present disclosure to overcome the disadvantages of the existing technological deficiencies of photo-detectors and their application within thermal imaging devices, with particular reference to mid and long wavelength infra-red detectors. This is facilitated in the present invention by a photo-detector sensitive to a target waveband comprising a photo absorbing layer, preferably exhibiting a thickness on the order of the optical absorption length. In an exemplary embodiment the photo absorbing layer is deposited to a thickness of between one and two times the optical absorption length. A contact layer is further provided, and a barrier layer is interposed between the photo absorbing layer and the contact layer. The barrier layer exhibits a thickness sufficient to prevent tunneling of majority carriers from the photo absorbing layer to the contact layer, and a band gap barrier sufficient to block the flow of thermalized majority carriers from the photo absorbing layer to the contact layer. The barrier layer does not significantly block minority carriers.

An infra-red detector in accordance with the principle of the invention can be produced using either an n-doped photo absorbing layer or a p-doped photo absorbing layer, in which the barrier layer is designed to have no offset for minority carriers and a band gap barrier for majority carriers. Current in the detector is thus almost exclusively by minority carriers. In particular, for an n-doped photo absorbing layer the junction between the barrier layer and the absorbing layer is such that there is substantially zero valence band offset, i.e. the band gap difference appears almost exclusively in the conduction band offset. For a p-doped photo absorbing layer the junction between the barrier layer and the absorbing layer is such that there is substantially zero conduction band offset, i.e. the band gap difference appears almost exclusively in the valence band offset.

Advantageously the photo-detector of the subject invention does not exhibit a depletion layer, and thus the dark current is significantly reduced. Furthermore, in an exemplary embodiment passivation is not required as the barrier layer further functions to achieve passivation.

An exemplary photo-detector of the present disclosure comprises: a photo absorbing layer comprising an n-doped semiconductor exhibiting a valence band energy level and a conducting band energy level; a barrier layer comprising a charge carrier compensated semiconductor, the barrier layer having an energy band gap and associated conduction and valence band energies, the barrier layer being compensated by doping impurities such that it exhibits a valence band energy level substantially equal to the valence band energy level of the photo absorbing layer and a conduction band energy level exhibiting a significant band gap in relation to the conduction band of the photo absorbing layer, a first side of the barrier layer adjacent a first side of the photo absorbing layer; and a contact area comprising a doped semiconductor, the contact area being adjacent a second side of the barrier layer opposing the first side, the barrier layer exhibiting a thickness, the thickness and the band gap being sufficient to prevent tunneling of majority carriers from the photo absorbing layer to the contact area and block the flow of thermalized majority carriers from the photo absorbing layer to the contact area.

In certain embodiments the barrier layer charge carrier compensated semiconductor having an energy band gap and associated conduction and valence band energies, the barrier layer being compensated by doping impurities such that the band energy gap, conduction, and valence band energies are close within a predetermined tolerance to the respective energy gap, conduction and valence band energies of an undoped barrier layer which exhibits a valence band energy level substantially equal to the valence band energy level of the photo absorbing layer and a conduction band energy level exhibiting a significant band gap in relation to the conduction band of the photo absorbing layer, a first side of the barrier layer adjacent a first side of the photo absorbing layer In one embodiment of the photo detector the barrier layer comprises an undoped semiconductor. In another embodiment the contact area is n-doped. In a further embodiment, the contact area exhibits a valence band energy level substantially equal to the valence band energy level of the n-doped semiconductor of the photo absorbing layer.

However due to contamination producing a purely undoped barrier layer is difficult, thus an aspect of the invention provides for a charge-carrier compensated barrier layer. Stated differently the charge-carrier compensated barrier layer is substantially equivalent in its behavior to the undoped barrier layer, yet eases manufacturing by compensating for the impurities introduced into the barrier layer, by intentional doping of an opposite type, the doping being sufficient to cause the barrier layer to have substantially the same energy and charge carrying characteristics of an undoped barrier layer. According to an aspect of the invention, in order to compensate for contamination of the barrier layer, sufficient doping of the opposite type to the contamination are introduce until the barrier exhibits a band gap which in combination with the barrier layer thickness, is sufficient to prevent tunneling of majority carriers from the photo absorbing layer to the contact area and block the flow of majority carriers from the photo absorbing layer to the contact area. Notably intentional doping of the barrier may be similarly compensated for and the term contamination shall be used to such intentional doping of the barrier layer.

Accordingly in an aspect of the invention there is provided a photo-detector comprising: a photo absorbing layer comprising an n-doped semiconductor exhibiting a valence band energy level and a conducting band energy level; a charge-carrier compensated barrier layer, a first side of the barrier layer adjacent a first side of the photo absorbing layer, the barrier layer exhibiting a valence band energy level substantially equal to the valence band energy level of the photo absorbing layer and a conduction band energy level exhibiting a significant band gap in relation to the conduction band of the photo absorbing layer; and a contact area comprising a doped semiconductor, the contact area being adjacent a second side of the barrier layer opposing the first side, the barrier layer having a thickness and being doped at sufficient amount and polarity of charge carriers to exhibit a band gap sufficient to prevent tunneling of majority carriers from the photo absorbing layer to the contact area and block the flow of thermalized majority carriers from the photo absorbing layer to the contact area. In certain embodiment the barrier layer is being intentionally doped by dopants of opposing types, and in other embodiments the barrier layer is being contaminated and doped by dopants of opposing types to those introduced into the barrier layers by the contamination.

In certain embodiments the doping charge-carriers introduced into the barrier layer are Beryllium, but such charge carriers may also be Carbon, Silicon, Tellurium, Tin and other atoms that behave as dopant for III-V material system.

In certain embodiment the barrier layer comprises AlSb, AlAsSb, AlGaSb, AlInSb, AlGaAsSb, AlGaInAsSb, or any combination thereof.

In one embodiment of the photo detector the contact area is p-doped. In one further embodiment the contact area exhibits a valence band energy level greater than the valence band energy level of the n-doped semiconductor of the photo absorbing layer. In another further embodiment the barrier layer comprises an undoped semiconductor.

In one embodiment of the photo detector the photo absorbing layer is operable to generate minority carriers in the presence of light energy exhibiting a wavelength of 3-5 microns. In another embodiment the photo-detector further comprises a substrate exhibiting a first side adjacent a second side of the photo absorbing layer, the second side of the photo absorbing layer opposing the first side of the photo absorbing layer, the substrate exhibiting a second side in contact with a metal layer. Preferably, the photo-detector further comprises an additional metal layer in contact with the contact area.

In one embodiment of the photo detector the barrier layer comprises one of AlSb, AlAsSb, GaAlAsSb, AlPSb, AlGaPSb and HgZnTe. In a further embodiment the photo absorbing layer is constituted of one of n-doped InAs, n-doped InAsSb, n-doped InGaAs, n-doped Type II super lattice InAs/InGaSb and n-doped HgCdTe. In a yet further embodiment of the photo detector the contact area is constituted of one of InAs, InGaAs, InAsSb, Type II super lattice InAs/InGaSb, HgCdTe and GaSb. In a yet further embodiment the contact area and the photo absorbing layer exhibit substantially identical compositions.

In one embodiment of the photo detector the photo absorbing layer and the contact area are constituted of n-doped HgCdTe and the barrier layer is constituted of HgZnTe, and in another embodiment the photo absorbing layer and the contact layer are constituted of n-doped type II super lattice InAs/InGaSb and the barrier layer is constituted of AlGaAsSb.

In another embodiment of the photo detector the photo absorbing layer is constituted of n-doped InAsSb, the barrier layer is constituted of AlGaAsSb and the contact layer is constituted of p-doped GaSb. In one embodiment the photo absorbing layer exhibits a thickness on the order of the optical absorption length.

Another embodiment of a photo-detector comprises: a photo absorbing layer comprising a p-doped semiconductor exhibiting a conduction band energy level and a valence band energy level; a barrier layer, a first side of the barrier layer adjacent a first side of the photo absorbing layer, the barrier layer exhibiting a conduction band energy level substantially equal to the conduction band energy level of the photo absorbing layer and a valence band energy level exhibiting a significant band gap in relation to the valence band of the photo absorbing layer; and a contact area comprising a doped semiconductor, the contact area adjacent a second side of the barrier layer opposing the first side, the barrier layer exhibiting a thickness, the thickness and the band gap being sufficient to prevent tunneling of majority carriers from the photo absorbing layer to the contact area and to block the flow of thermalized majority carriers from the photo absorbing layer to the contact area.

In one embodiment of a photo-detector the barrier layer comprises an undoped semiconductor. In another embodiment the contact area is p-doped. In one further embodiment of a photo-detector the contact area exhibits a conduction band energy level substantially equal to the conduction band energy level of the p-doped semiconductor of the photo absorbing layer.

In one embodiment of a photo-detector the contact area is n-doped. In one further embodiment the contact area exhibits a conduction band energy level less than the conduction band energy level of the p-doped semiconductor of the photo absorbing layer. In another further embodiment the barrier layer comprises an undoped semiconductor.

In one embodiment of a photo-detector the photo absorbing layer is operable to generate minority carriers in the presence of light energy exhibiting a wavelength of 3-5 microns. In another embodiment the photo-detector further comprises a substrate exhibiting a first side adjacent a second side of the photo absorbing layer, the second side of the photo absorbing layer opposing the first side of the photo absorbing layer, the substrate exhibiting a second side in contact with a metal layer. In a further embodiment the photo-detector further comprises a metal layer in contact with the contact area.

In one embodiment of a photo-detector the barrier layer comprises one of AlSb, AlAsSb, GaAlAsSb, AlPSb, AlGaPSb, InAlAs, InAlAsSb, and HgZnTe. In one further embodiment the photo absorbing layer is constituted of one of p-doped InAs, p-doped InAsSb, p-doped InGaAs, p-doped Type II super lattice InAs/InGaSb and p-doped HgCdTe. In one yet further embodiment the contact area is constituted of one of InAs, InGaAs, InAsSb, Type II super lattice InAs/InGaSb, HgCdTe and GaSb. In one yet further embodiment the contact area and the photo absorbing layer exhibit substantially identical compositions.

An exemplary method of producing a photo-detector, comprises: providing a substrate; depositing on the substrate a photo absorbing layer comprising a doped semiconductor exhibiting an energy level associated with non-conducting majority carriers; depositing on the deposited photo absorbing layer a barrier layer exhibiting a thickness, an energy level associated with minority carriers of the photo absorbing layer substantially equal to the energy level of the photo absorbing layer and a band gap associated with majority carriers of the photo absorbing layer; and depositing on the deposited barrier layer a contact layer comprising a doped semiconductor, the thickness and the band gap of the barrier layer being sufficient to prevent tunneling of majority carriers from the photo absorbing layer to the contact layer and to block the flow of thermalized majority carriers from the photo absorbing layer to the contact layer.

In one embodiment the method further comprises selectively etching the deposited contact layer to define a plurality of contact areas. In another embodiment at least one of depositing the photo absorbing layer, depositing the barrier layer and depositing the contact layer is done via one of molecular beam epitaxy, metal organic chemical vapor deposition, metal organic phase epitaxy and liquid phase epitaxy.

It is noted that while the photodetector is preferably manufactured on a substrate as described, certain embodiments may remove the substrate or a portion thereof in the final photodetector, and thus in an embodiment of the invention there is provided a photo detector.

Additional features and advantages of the invention will become apparent from the following drawings and description.

SHORT DESCRIPTION OF DRAWINGS

For a better understanding of the invention and to show how the same may be carried into effect, reference will now be made, purely by way of example, to the accompanying drawings in which like numerals designate corresponding elements or sections throughout.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings:

FIGS. 5a, 5B, 5C, 5D, 5E and 5F illustrate examples of existing applications of the prior-art photo-detector technology.

FIG. 6 illustrates the existing external components of an exemplary thermal imaging device with an integrated dewar cooler assembly, hereafter IDCA.

FIG. 7 illustrates the internal components of an exemplary application of the disclosed subject matter.

Figure 11:
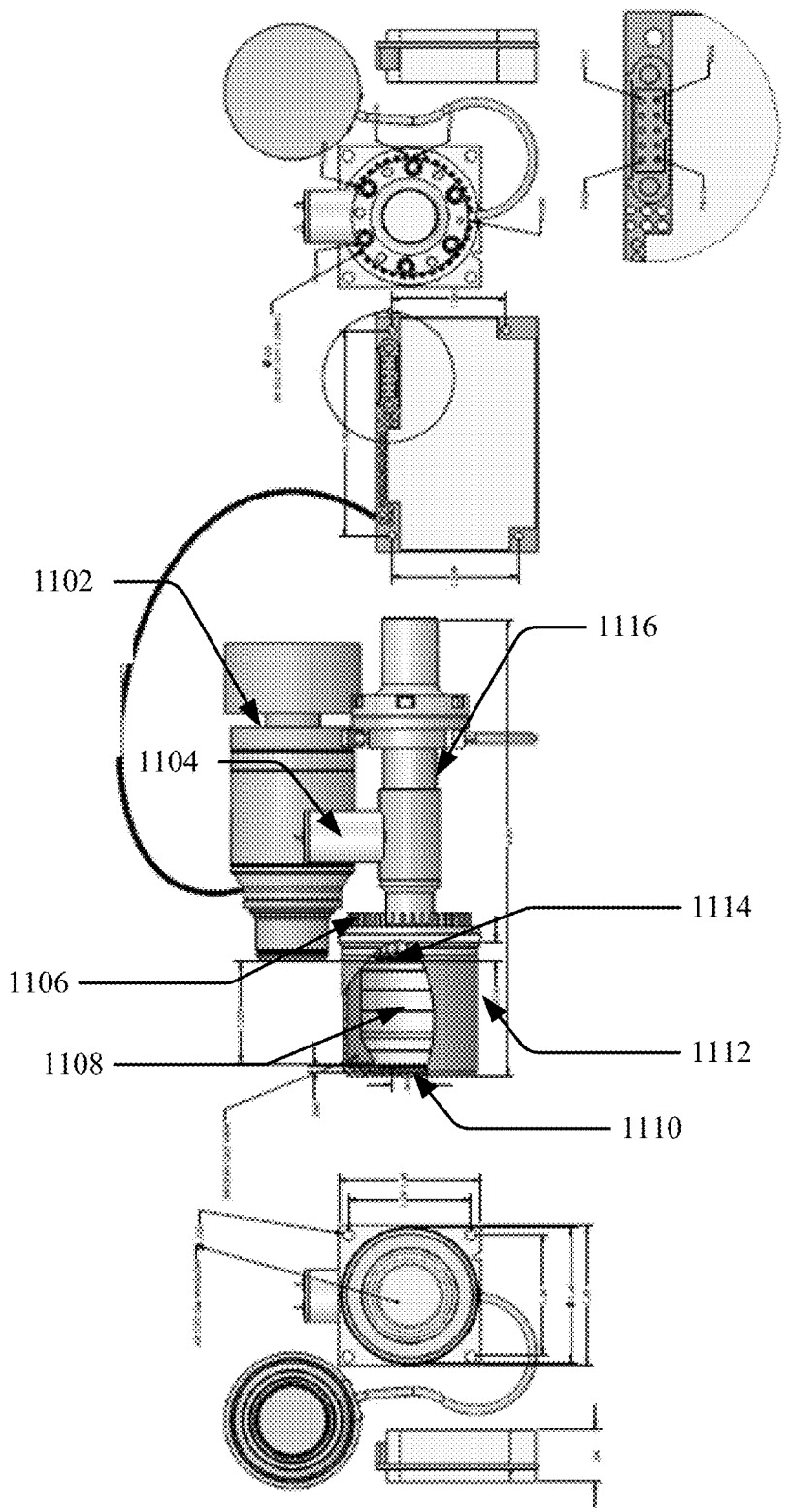
Figure 11A:
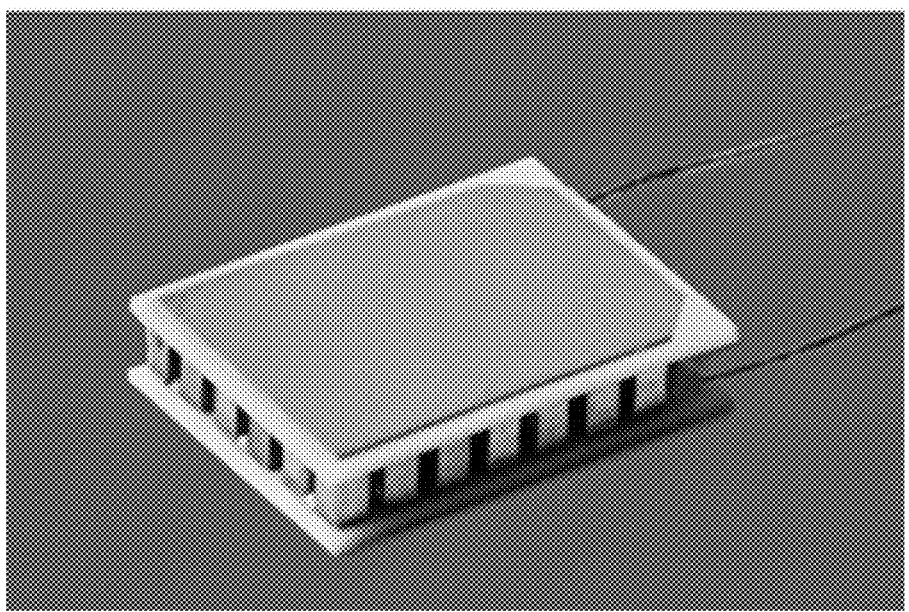
Figure 11B:
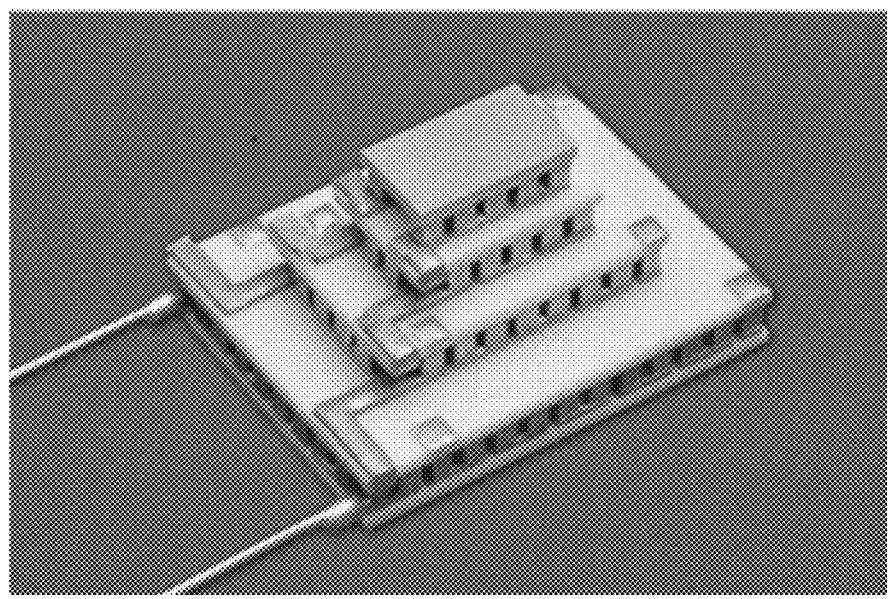
Figure 11C:
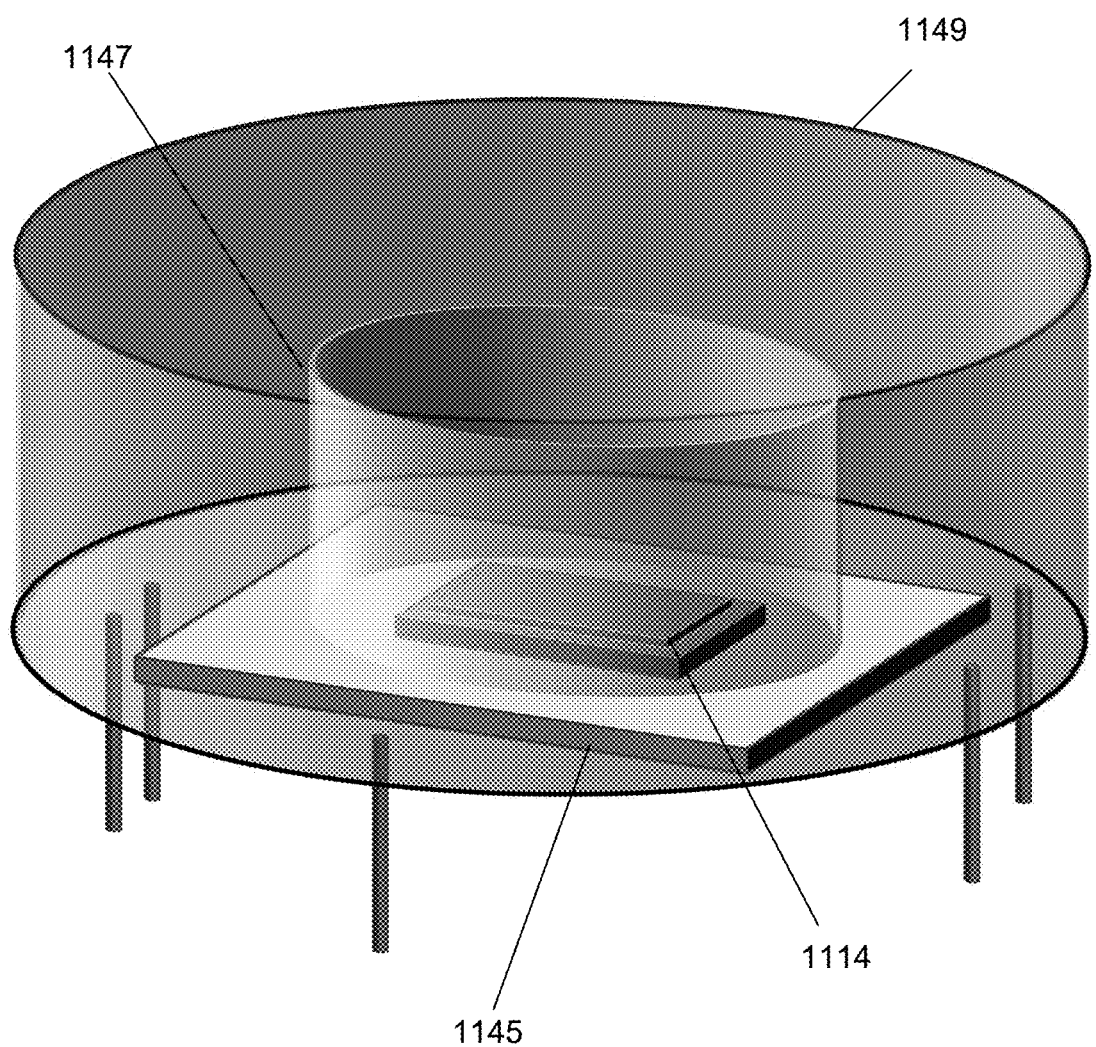

FIG. 11 illustrates a schematic application of the disclosed subject matter. FIG. 11A depicts schematically a single stage TEC, and FIG. 11B depicts a multi-stage TEC. FIG. 11C depicts schematically a FPA 1114 disposed on a TEC 1145.

Figure 12:
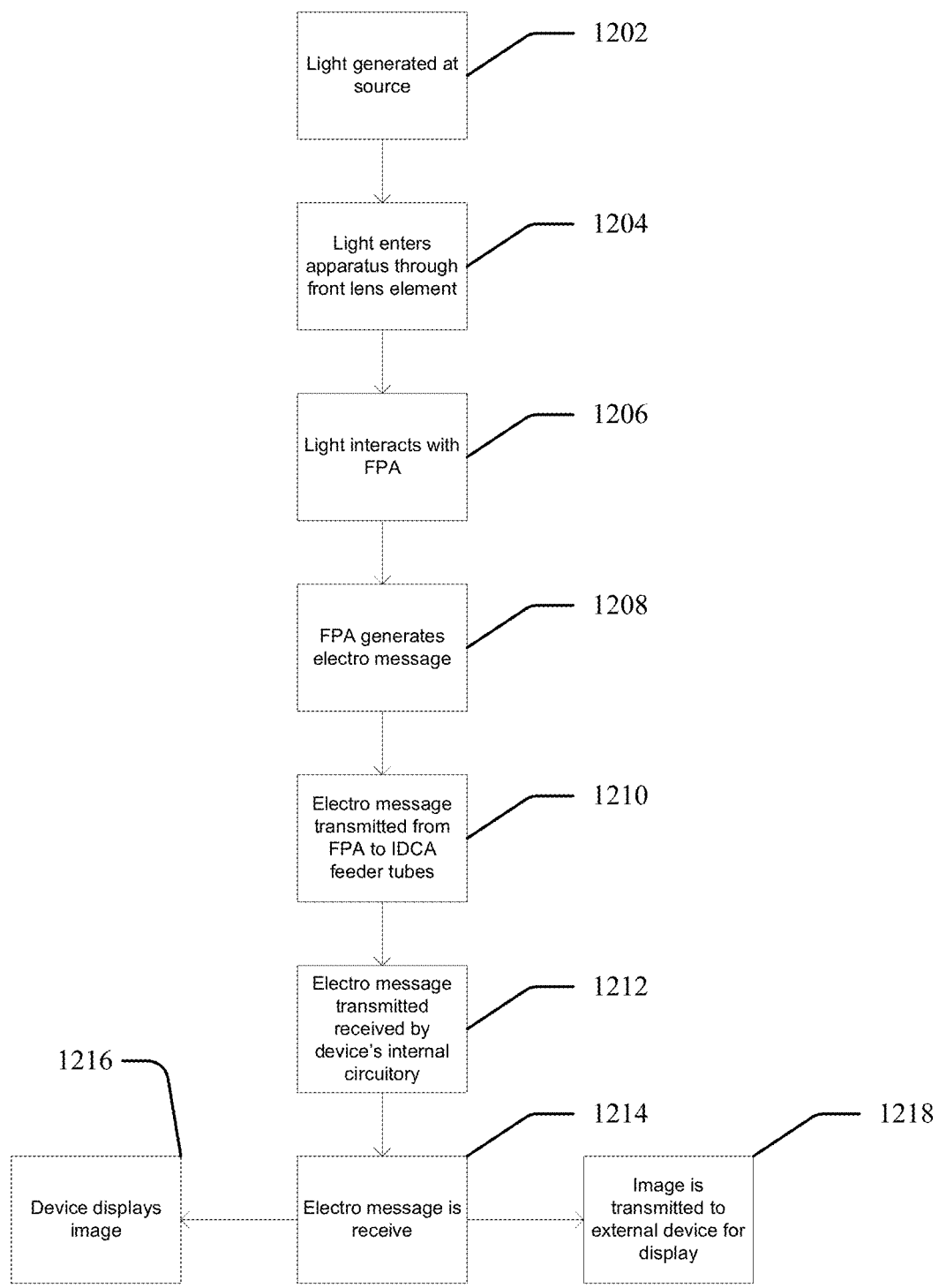

FIG. 12 illustrates an operational flow chart of an exemplary optical imaging device with an IDCA comprising the disclosed FPA.

Figure 13A:
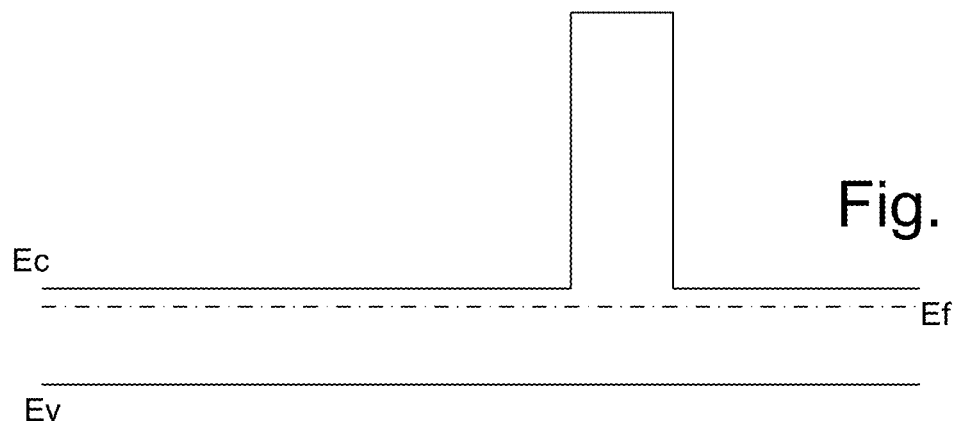
Figure 13B:
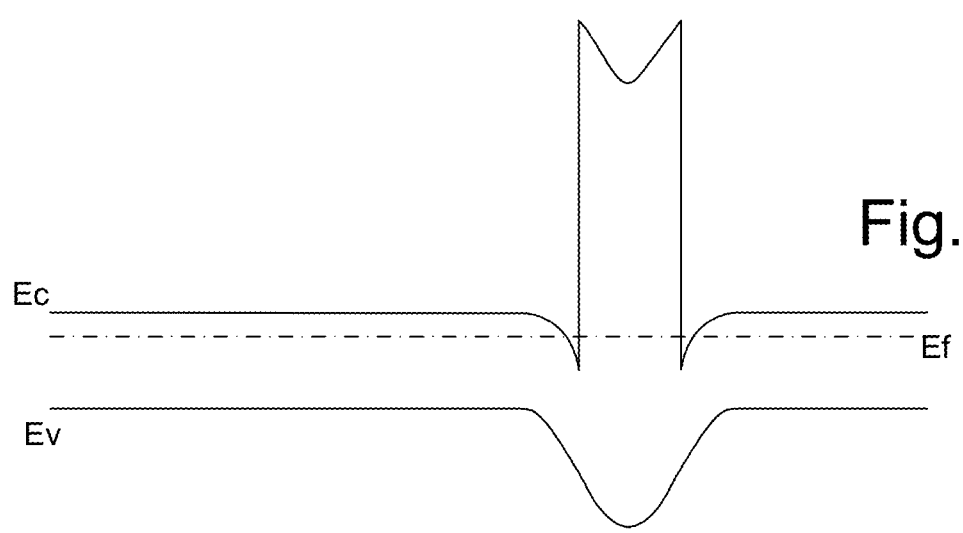
Figure 13C:
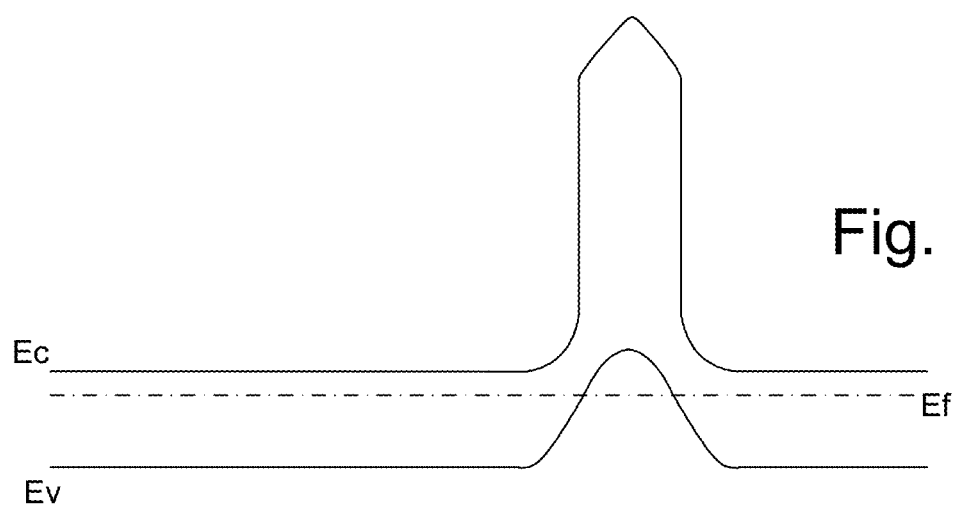

FIG. 13A depicts simplified energy band diagram in an undoped barrier layer. FIG. 13B depicts a simplified energy band diagram of an N-type doped barrier layer. FIG. 13C depicts a simplified energy band diagram of a P-type doped barrier.

DETAILED DESCRIPTION

The present embodiments enable a photo-detector sensitive to a target waveband comprising a photo absorbing layer, preferably exhibiting a thickness on the order of an optical absorption length of the target waveband. In an exemplary embodiment the photo absorbing layer is deposited to a thickness of between one and two times the optical absorption length. A contact layer is further provided, and a barrier layer is interposed between the photo absorbing layer and the contact layer. The barrier layer exhibits a thickness sufficient to prevent tunneling of majority carriers from the photo absorbing layer to the contact layer, and a band gap barrier sufficient to block the flow of thermalized majority carriers from the photo absorbing layer to the contact layer. The barrier layer does not significantly block minority carriers.

An infra-red detector in accordance with the principle of the invention can be produced using either an n-doped photo absorbing layer or a p-doped photo absorbing layer, in which the barrier layer is designed to have substantially no offset for minority carriers and a band gap barrier for majority carriers. Current in the detector is thus almost exclusively by minority carriers. In particular, for an n-doped photo absorbing layer the junction between the barrier layer and the absorbing layer is such that there is substantially zero valence band offset, i.e. the band gap difference appears almost exclusively in the conduction band offset. For a p-doped photo absorbing layer the junction between the barrier layer and the absorbing layer is such that there is substantially zero conduction band offset, i.e. the band gap difference appears almost exclusively in the valence band offset.

Advantageously the photo-detector of the subject invention does not exhibit a depletion layer, and thus the dark current is significantly reduced. Furthermore, in an exemplary embodiment passivation is not required as the barrier layer further functions to achieve passivation.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

Figure 1A:
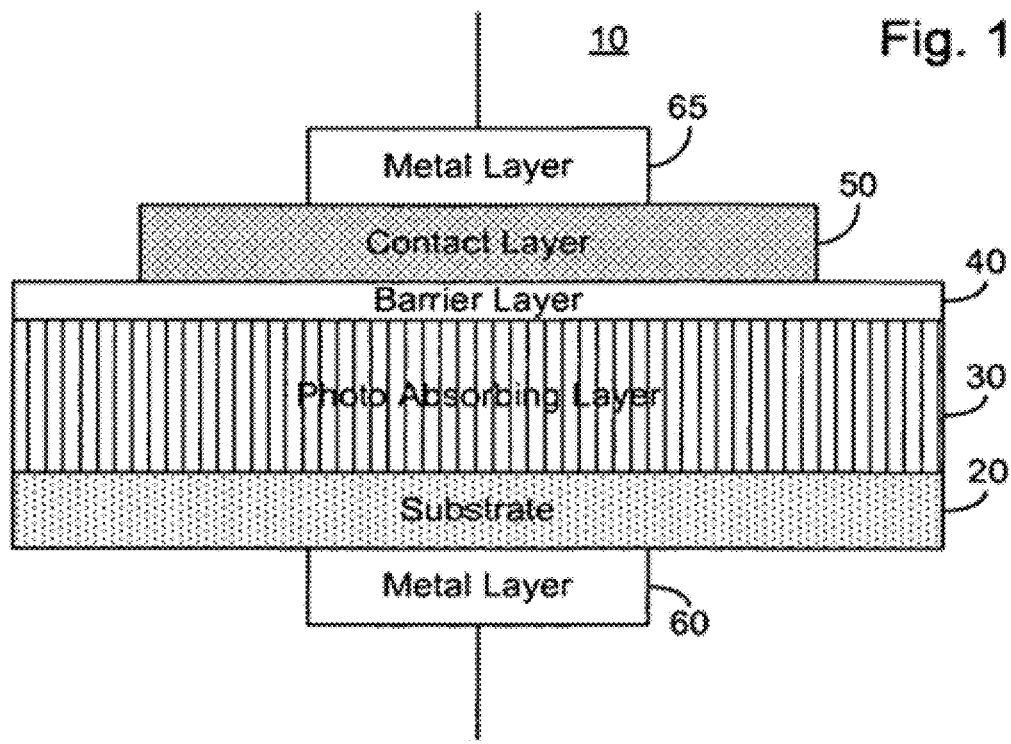
FIG. 1A illustrates a high level schematic view of the layers of a single photo-detector according to an embodiment of the principle of the invention.

FIG. 1A illustrates a high level schematic view of the layers of a photo-detector 10 according to an embodiment of the principle of the invention comprising a substrate 20, a photo absorbing layer 30, a barrier layer 40, a contact layer 50, a metal layer 60 and a metal layer 65. Substrate 20 is provided as a base for deposition and has deposited on one face metal layer 60 for connection to electronic circuitry. In an exemplary embodiment metal layer 60 is constituted of gold. Photo absorbing layer 30 is deposited on the second face of substrate 20 opposing the first face. Photo absorbing layer 30 comprises a doped semiconductor responsive to photons of the object wavelength, and preferably is deposited to a thickness on the order of an optical absorption length. In one embodiment photo absorbing layer 30 is deposited to a thickness of between one and two times the optical absorption length. In an exemplary embodiment photo absorbing layer 30 comprises one of n-doped InAs; n-doped InAsSb; n-doped InGaAs; n-doped type II super lattice of the type InAs/InGaSb; and n-doped HgCdTe. In an alternative embodiment absorbing layer 30 comprises one of p-doped InAs; p-doped InAsSb; p-doped InGaAs; p-doped type II super lattice of the type InAs/InGaSb; and p-doped HgCdTe.

Barrier layer 40 is deposited directly on photo absorbing layer 30 without requiring passivation. Barrier layer 40 is deposited to a thickness sufficient to substantially prevent tunneling of majority carriers from photo absorbing layer 30 to contact layer 50, and in an exemplary embodiment is deposited to a thickness of 50-100 nm. Barrier layer 40 comprises a material selected to exhibit a high band gap barrier for majority carriers from photo absorbing layer 30 and substantially no band gap barrier for minority carriers. Barrier layer 40 is thus sufficient to block both the flow of thermalized majority carriers and the tunneling of majority carriers from photo absorbing layer 30 to contact layer 50. Thus, for an n-type photo absorbing layer 30, the band gap difference appears in the conduction band, whereas substantially no band gap offset appears in the valence band. In one embodiment barrier layer 40 comprises one of AlSb, AlAsSb, GaAlAsSb, AlPSb, AlGaPSb and HgZnTe. In an exemplary embodiment photo absorbing layer 30 comprises n-doped InAs and barrier layer 40 is comprised of AlAsxSb1−x with x~0.15, and thus there is ~0 valence band offset.

FIG. 13A depicts a simplified energy band diagram for an undoped barrier layer. The skilled in the art would readily understand that a photodetector having an undoped barrier, and exhibiting energy band diagram approximated by FIG. 13A would operate at a very small, and even at zero, bias voltage, as there is no band bending or any barriers that would place minority carriers in the forbidden band. Yet clearly the rise in the conduction band energy Ec significantly above the Fermi level would block majority carries flow.

FIG. 13B depicts a simplified band energy diagram for an N-type doped barrier, which as seen will form a depleted zone, and thus will generate band bending above the conduction bands and in the absorber and the contact layers, resulting from the continuation of the electric field. The noted dip in the valance energy level would act to inhibit minority carrier transfer.

FIG. 13C depicts a simplified band energy diagram of a P-type doped barrier, which would generates a depleted zone in the absorber. The depleted zone would generate SRH (Shocley Rheed Hall) currents, and cause an energy well below the barrier. The well will collect the minority carriers and prevent their transfer to the contact layer, thus impairing the operation of the device as a focal plane array. Additionally, once this well is populated with carriers it will cause a short circuit in the barrier layer and thus result in a short circuited focal plane array.

It is seen therefore that the use of undoped barrier is an important feature of the invention. The band energy levels stemming from the use of undoped barrier layer rise from the advantages of avoidance of band bending in the barrier so minority carriers can flow with minimal impedance between the absorber layer and the contact layer. Overcoming band bending requires a bias voltage, which adversely affects the photodetector noise figures and other operating parameters. However, as described above, contamination during the manufacturing process may cause unintentional doping. Such doping must be minimized in order to avoid charge density which cause sufficient band bending will impede minority charge carriers flow. While some band bending often exists even in barrier layers of high purity, the desired level of band bending introduced by the barrier layer preferably has only negligible effect on the flow of minority carriers. The specific band bending which is considered negligible for the barrier layer of a specific photodetector is a matter of design parameter choice. However in certain Molecular Beam Epitaxy (MBE) systems oxygen, carbon, and other elements often contaminates growing materials. Unintended contamination by such contaminants is often most significant when growing materials like AlAsSb, GaAlSb, AlSb and InAlSb. Oxygen is oftentimes the main source of contamination, and typically chemically couples to layers having aluminum, with AlSb compositions being especially vulnerable. In such layers oxygen behaves as a deep donor and its level depends on the MBE system state and internal cleanliness. Carbon monoxide and carbon dioxide, water, and the like are common sources for oxygen contamination as well as others like carbon. Commonly some MBE systems present an oxygen density in the barrier layer approximating a low of ~2e17cm−3 and some MBE systems may present oxygen density approximating such high levels as ~1e19cm−3. This deep donors will cause a depletion zone and will generate the undesirable band banding in the barrier.

In order to mitigate the difficulties presented by contamination, and as seen below equivalently by an optional intentional doping of the barrier layer, the present invention provides for introducing a dopant into the barrier layer, the dopant being of opposing type of the equivalent contaminating dopant, such that the resulting charge-carrier compensated barrier layer exhibits energy band gap substantially similar to the undoped barrier layer.

An aspect of the invention solves the contamination problem by compensating the charge donor concentrations by introducing acceptors to the barrier layer. Beryllium, carbon, or other P-type dopant in sufficient concentrations would in compensated charge carrier barrier layer which in turn would result in smaller effective charge density in the barrier (charge density=q(Nd—Na) where q is the electron charge=1.6e−19 columb, Nd being the donor concentration and Na being the acceptor concentration).

The amount of dopant required to provide compensation and make the charge-carrier compensated barrier layer substantially equivalent to an undoped layer is believed to best be carried out experimentally. By creating a number of photodetector devices and measuring the required bias voltage to have the device operate satisfactorily. Several iterations may be required to bracket the required amount of dopant required to achieve the desired result, however once found a large number of devices may be made, until conditions within the MBE system change to require yet another determination.

Further, in certain embodiments some doping of the barrier may be desired in order to adjust characteristics of the barrier, such as crystallographic characteristics, electrical characteristics, and the like. In such cases the barrier layer may be doped by the desired dopant, but the doping is compensated by an opposing type dopant, to substantially provide the desired energy bands of an undoped barrier layer. Notably, variations of dopant concentrations throughout the barrier layer are also contemplated.

Following is a non-limiting example for the process required to determine the amount of doping required to obtain the 'substantially undoped barrier layer' equivalence. The example assumes that the sources of the contamination is Oxygen, and that the dopant elected to compensate for the contamination is Beryllium. The design requirements of the example call for of operation bias voltage of 50 mV or less. A batch of photodetectors is manufactured utilizing a specific MBE system, without adding any beryllium, and the bias voltage required for operating the devices is then measured and potentially averaged. If the operating voltage is higher than required 50 mV a second batch of photodetectors is made where the barrier layer is doped by a selected amount of beryllium, and the second batch is tested. Additional batches are tested as required with beryllium is added between batches until the devices meet the specified tolerance, or until the devices begin to underperform, such as by developing depletion currents because of excessively over compensation. Such currents would imply that the photodetector has in effect became a diode and that the amount of beryllium must be reduced.

Once the correct amount of compensation doping is determined per machine a large number of photodetectors may be produced and common quality control techniques may be used to indicate when a different amount is required. Small adjustments would likely be required for compensation of relatively small deviations from the design requirements.

Contact layer 50 is deposited on barrier layer 40. Contact layer 50 functions to absorb the minority carriers diffused from the absorbing layer 30 and is essentially a contact layer. In an exemplary embodiment contact layer 50 is deposited to a thickness of 20-50 nm and is constituted of one of InAs; InAsSb; InGaAs; type II super lattice of the type InAs/InGaSb; HgCdTe and GaSb. Contact layer 50 may be n-doped or p-doped without exceeding the scope of the invention. Advantageously, contact layer 50 may be constituted of the same material as photo absorbing layer 30. Contact layer 50 is etched, preferably by photolithography, to define the detector area. Advantageously etching of barrier layer 40 or absorbing layer 30 is not required. Metal layer 65 is deposited on contact layer 50, and in an exemplary embodiment is constituted of gold. Metal layers 60, 65 enable the connection of an appropriate bias, and a connection to detect a flow of current from photo absorbing layer 30 to contact layer 50.

Figure 1B:
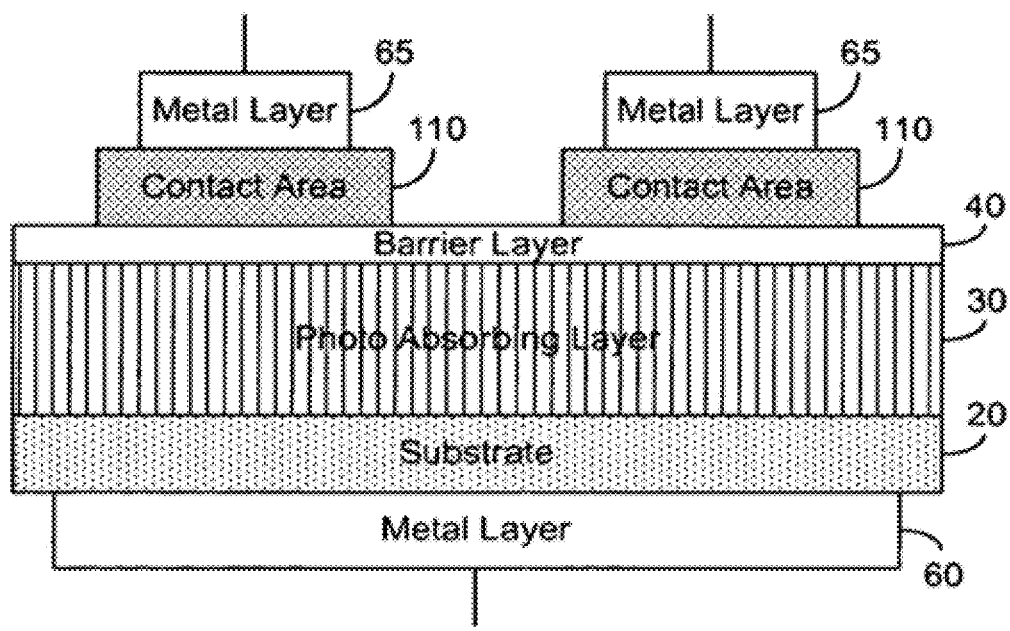
FIG. 1B illustrates a side view of a multi-pixel photo-detector according to an embodiment of the principle of the invention.

FIG. 1B illustrates a side view of a multi-pixel photodetector 100 according to an embodiment of the principle of the invention comprising substrate 20, photo absorbing layer 30, barrier layer 40, a first and second contact area 110, a metal layer 6 and a metal layer 65. Substrate 20 is provided as a base for deposition and has deposited on one face metal layer 60 for connection to electronic circuitry. In an exemplary embodiment metal layer 60 is constituted of gold. Photo absorbing layer 30 is deposited on the second face of substrate 20 opposing the first face. Photo absorbing layer 30 comprises a doped semiconductor responsive to photons of the object wavelength, and preferably is deposited to a thickness on the order of an optical absorption length. In one embodiment photo absorbing layer 30 is deposited to between one and two times the optical absorption length. In an exemplary embodiment photo absorbing layer 30 comprises one of n-doped InAs; n-doped InAsSb; n-doped InGaAs; n-doped type II super lattice of the type InAs/InGaSb; and n-doped HgCdTe. In an alternative embodiment absorbing layer 30 comprises one of p-doped InAs; p-doped InAsSb; p-doped InGaAs; p-doped type II super lattice of the type InAs/InGaSb; and p-doped HgCdTe.

The substrate is generally transparent to wavelengths of interest. However as certain substrates may block certain portions of the spectrum, in some embodiments the substrate, or portions thereof, may be removed to allow all the spectrum of interest to be detected by the photodetector array.

Barrier layer 40 is deposited directly on photo absorbing layer 30 without requiring passivation. Barrier layer 40 is deposited to a thickness sufficient to substantially prevent tunneling of majority carriers from photo absorbing layer 30 to first and second contact area 110, and in an exemplary embodiment is deposited to a thickness of 50-100 nm. Barrier layer 40 comprises a material selected to exhibit a high band gap barrier for majority carriers from photo absorbing layer 30 and substantially no band gap barrier for minority carriers. Barrier layer 40 is thus sufficient to block both the flow of thermalized majority carriers and the tunneling of majority carriers from photo absorbing layer 30 to first and second contact area 110. Thus, for an n-type photo absorbing layer 30, the band gap difference appears in the conduction band, whereas substantially no band gap offset appears in the valence band. In one embodiment barrier layer 40 comprises one of AlSb, AlAsSb, GaAlAsSb, AlPSb, AlGaPSb and HgZnTe. In an exemplary embodiment photo absorbing layer 30 comprises n-doped InAs and barrier layer 40 is comprised of $AlAs_xSb_{1-x}$ with x~0.15, and thus there is ~0 valence band offset.

Contact layer 50 as described above in relation to FIG. 1A is deposited on barrier layer 40. Contact layer 50, which as will be described further is etched to define first and second contact area 110, functions to absorb the minority carriers diffused from the absorbing layer 30 and is essentially a contact layer. In an exemplary embodiment contact layer 50 is deposited to a thickness of 20-50 nm and is constituted of one of InAs; InAsSb; InGaAs; type II super lattice of the type InAs/InGaSb; HgCdTe and GaSb. Contact layer 50 may be n-doped or p-doped without exceeding the scope of the invention. Advantageously, contact layer 50 may be constituted of the same material as photo absorbing layer 30. Contact layer 50 is etched, preferably by photolithography, to define first and second contact area 110. Advantageously etching of barrier layer 40 or absorbing layer 30 is not required. In an exemplary embodiment a selective etchant is used which does not etch barrier layer 40. Metal layer 65 is deposited on each of first and second contact area 110, and in an exemplary embodiment is constituted of gold. Thus, a single photo absorbing layer and barrier layer is utilized, with each unetched portion of contact layer 50 defining a pixel or individual detector.

The above has been described in an embodiment in which two pixels, or detectors are defined, however this is not meant to be limiting in any way. A large array of photodetectors produced as above is specifically included in the invention.

Figure 1C:
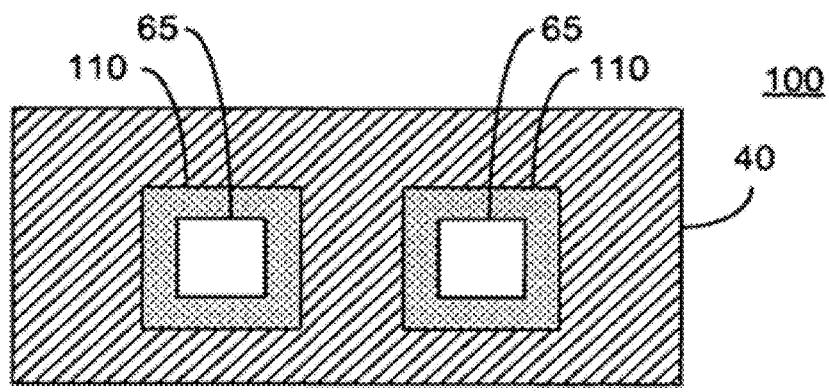
FIG. 1C illustrates a top level view of the multi-pixel photo-detector of FIG. 1B according to a principle of the invention.

FIG. 1C illustrates a top level view of multi-pixel photodetector 100 of FIG. 1B according to a principle of the invention showing barrier layer 40, first and second contact area 110 and metal layer 65 defined on each of first and second contact area 110.

Figure 2A:
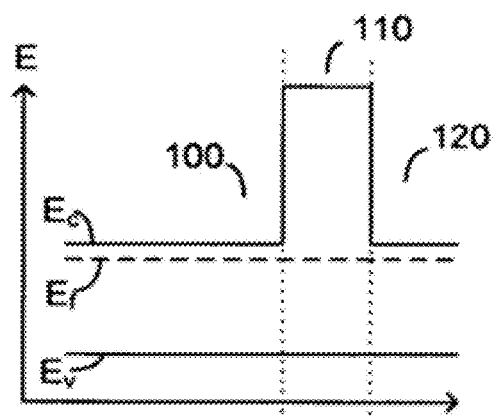
FIG. 2A illustrates the energy band levels of an embodiment of the structure of FIG. 1 according to the principle of the invention in which the photo absorbing layer is n-doped and the contact layer is n-doped.

FIG. 2A illustrates the energy band levels of an embodiment of the structure of FIG. 1 according to the principle of the invention in which the photo absorbing layer is n-doped and the contact layer is n-doped, in which the x-axis indicates position along the structure of FIG. 1 and the y-axis indicates energy levels in an arbitrary illustrative manner. Three energy band levels are depicted: $E_v$, the valence band energy band level; $E_f$, the Fermi energy band level; and $E_c$ the conducting band energy level. Area 100 represents the energy band levels within photo absorbing layer 30, area 110 represents the energy band levels within barrier layer 40 and area 120 represent the energy band levels within contact layer 50.

The valence band energy level is substantially constant throughout areas 100, 110 and 120, and thus minority carriers are not obstructed from flowing from photo absorbing area 100 to contact area 120. It is to be noted that due to the energy levels the minority carriers are captured in contact area 120. Barrier layer 40, represented by area 110, is thick enough so that there is negligible tunneling of majority carriers through it. In an exemplary embodiment barrier layer 40 is deposited to a thickness of 50-100 nm, and the band gap barrier of area 110 is high enough so that there is negligible thermal excitation of majority carriers over it. Area 120 shows energy band levels on a par with that of area 100 however this is not meant to be limiting in any way. In one embodiment $E_f$ in contact layer area 120 is slightly higher than their values in photo absorbing area 100 with the increase being attributed to an increased doping concentration. It is to be noted that no depletion layer is present and therefore there is no SRH current. Photocurrent is a result of optically generated minority carriers which diffuse from photo absorbing area 100 to contact area 120.

Figure 2B:
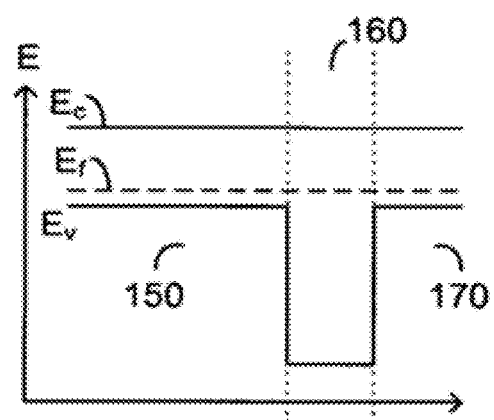
FIG. 2B illustrates the energy band levels of an embodiment of the structure of FIG. 1 according to the principle of the invention in which the photo absorbing layer is p-doped and the contact layer is p-doped.

FIG. 2B illustrates the energy band levels of an embodiment of the structure of FIG. 1 according to the principle of the invention in which the photo absorbing layer is p-doped and the contact layer is p-doped; in which the x-axis indicates position along the structure of FIG. 1 and the y-axis indicates energy levels in an arbitrary illustrative manner. Three energy band levels are depicted: $E_v$, the valence band energy level; $E_f$, the Fermi energy band level; and $E_c$ the conducting band energy level. Area 150 represents the energy band levels within photo absorbing layer 30, area 160 represents the energy band levels within barrier layer 40 and area 170 represent the energy band levels within contact layer 50.

The conduction band energy level is substantially constant throughout areas 150, 160 and 170, and thus minority carriers are not obstructed from flowing from photo absorbing area 150 to contact area 170. It is to be noted that due to the energy levels the minority carriers are captured in contact area 170. Barrier layer 40, represented by area 160, is thick enough so that there is negligible tunneling of majority carriers through it. In an exemplary embodiment barrier layer 40 is deposited to a thickness of 50-100 nm, and the band gap barrier of area 160 is high enough so that there is negligible thermal excitation of majority carriers over it. Area 170 shows energy band levels on a par with that of area 150 however this is not meant to be limiting in any way. In one embodiment $E_f$ in contact layer area 170 is slightly higher than their values in photo absorbing area 150 with the increase being attributed to an increased doping concentration. It is to be noted that no depletion layer is present and therefore there is no SRH current. Photocurrent is a result of optically generated minority carriers which diffuse from photo absorbing area 150 to contact area 170.

Figure 3A:
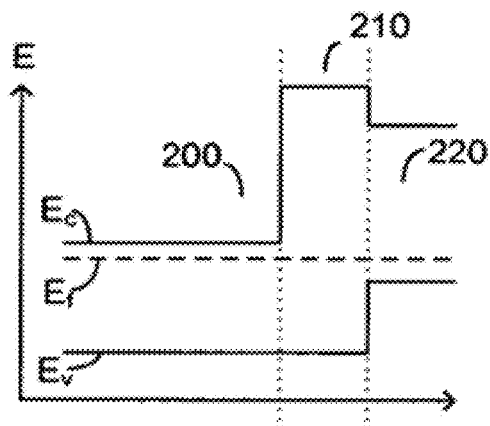
FIG. 3A illustrates the energy band levels of an embodiment of the structure of FIG. 1 according to the principle of the invention in which the photo absorbing layer is n-doped and the contact layer is p-doped.

FIG. 3A illustrates the energy band levels of an embodiment of the structure of FIG. 1 according to the principle of the invention in which the photo absorbing layer is n-doped and the contact layer is p-doped; in which the x-axis indicates position along the structure of FIG. 1 and the y-axis indicates energy levels in an arbitrary illustrative manner. Three energy band levels are depicted: $E_v$, the valence band energy level; $E_f$, the Fermi energy band level; and $E_c$ the conducting band energy level. Area 200 represents the energy band levels within photo absorbing layer 30, area 210 represents the energy band levels within barrier layer 40 and area 220 represent the energy band levels within contact layer 50.

The valence band energy level is substantially constant throughout areas 200 and 210 and is higher in area 220, and thus minority carriers are not obstructed from flowing from photo absorbing area 200 to contact area 220. It is to be noted that due to the energy levels the minority carriers are captured in contact area 220. Barrier layer 40, represented by area 210, is thick enough so that there is negligible tunneling of majority carriers through it. In an exemplary embodiment barrier layer 40 is deposited to a thickness of 50-100 nm, and the band gap barrier of area 210 is high enough so that there is negligible thermal excitation of majority carriers over it. It is to be noted that no depletion layer is present and therefore there is no SRH current. Photocurrent is a result of optically generated minority carriers which diffuse from photo absorbing area 200 to contact area 220.

Figure 3B:
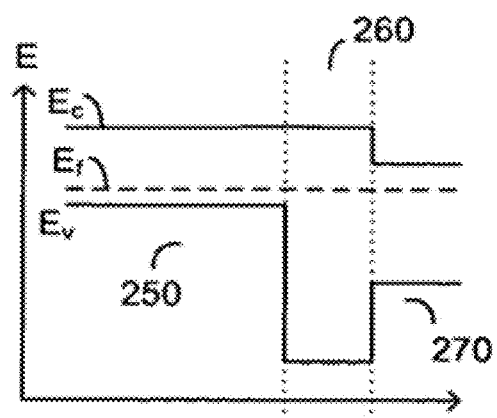
FIG. 3B illustrates the energy band levels of an embodiment of the structure of FIG. 1 according to the principle of the invention in which the photo absorbing layer is p-doped and the contact layer is n-doped.

FIG. 3B illustrates the energy band levels of an embodiment of the structure of FIG. 1 according to the principle of the invention in which the photo absorbing layer is p-doped and the contact layer is n-doped; in which the x-axis indicates position along the structure of FIG. 1 and the y-axis indicates energy levels in an arbitrary illustrative manner. Three energy band levels are depicted: $E_v$, the valence band energy level; $E_f$, the Fermi energy band level; and $E_c$ the conducting band energy level. Area 250 represents the energy band levels within photo absorbing layer 30, area 260 represents the energy band levels within barrier layer 40 and area 270 represent the energy band levels within contact layer 50.

The conduction band energy level is substantially constant throughout areas 250 and 260 and it is lower in area 270, and thus minority carriers are not obstructed from flowing from the photo absorbing area 250 to contact area 270. It is to be noted that due to the energy levels the minority carriers are captured in contact area 270. Barrier layer 40, represented by area 260, is thick enough so that there is negligible tunneling of majority carriers through it. In an exemplary embodiment barrier layer 40 is deposited to a thickness of 50-100 nm, and the band gap barrier of area 260 is high enough so that there is negligible thermal excitation of majority carriers over it. It is to be noted that no depletion layer is present and therefore there is no SRH current. Photocurrent is a result of optically generated minority carriers which diffuse from photo absorbing area 250 to contact area 270.

Figure 4:
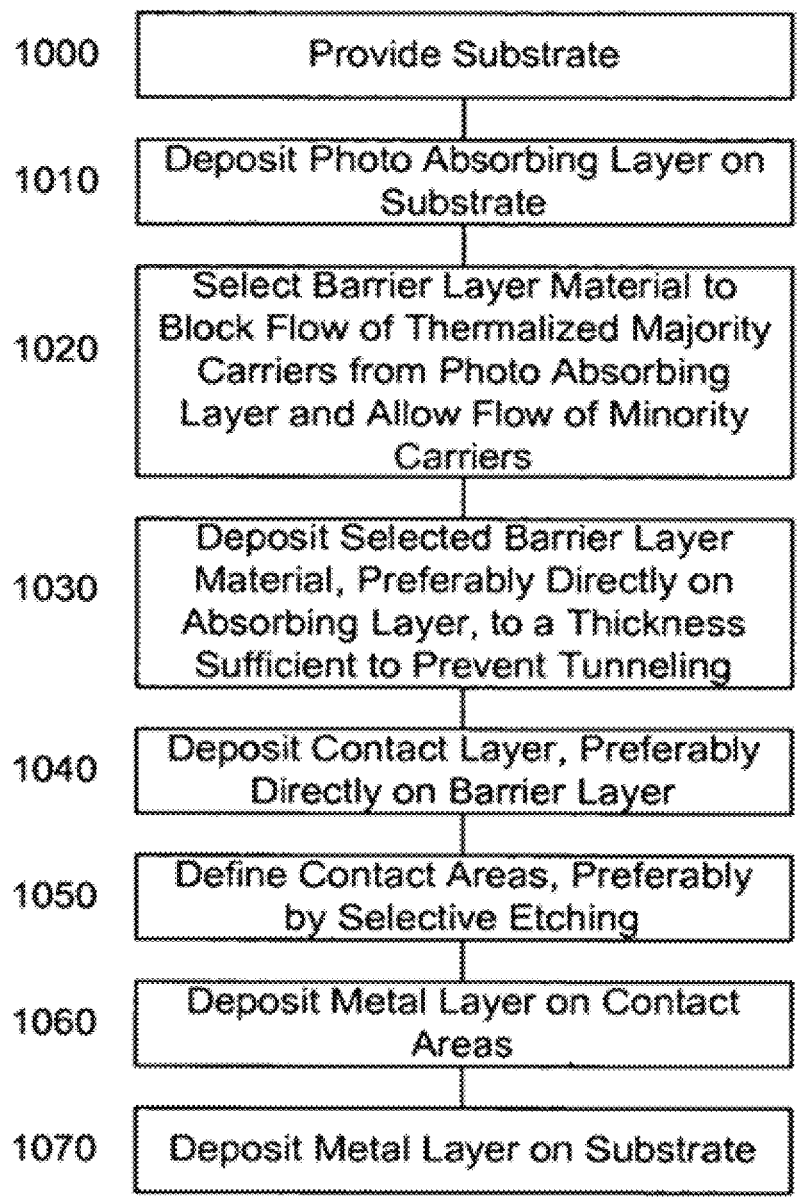
FIG. 4 illustrates a high level flow chart of the process of manufacture of the multi pixel photo-detector of FIGS. 1B-1C.

FIG. 4 illustrates a high level flow chart of the process of manufacture of the photo-detector of FIG. 1. In stage 1000 a substrate material is provided as a support for deposition. In stage 1010, a photo absorbing layer is deposited on the substrate. Preferably the photo absorbing layer is deposited to a thickness on the order of the optical absorption length and in an exemplary embodiment is deposited to a thickness of between one and two times the optical absorption length.

In stage 1020, a barrier material is selected such that the flow of thermalized majority carriers from the photo absorbing layer deposited in stage 1010 would be negligible, and the flow of minority carriers is not impeded. In stage 1030, the barrier material selected in stage 1020 is deposited to a thickness sufficient to prevent tunneling of majority carriers through the barrier material. In an exemplary embodiment the thickness is between 50 and 100 nm. Preferably the barrier material is deposited directly on the photo absorbing layer deposited in stage 1010.

In stage 1040, a contact layer is deposited, preferably directly on the barrier material deposited in stage 1030. In stage 1050, the desired contact areas are defined. Preferably, the contact areas are defined by photolithography and a selective etchant which stops on the top of the barrier layer. Alternatively, the etchant may be controlled to stop once the uncovered portions of contact layer 50 are removed. Thus, the depth of the etch is equivalent to the thickness of the contact layer 50. Advantageously, in an exemplary embodiment no other layer is etched.

In stage 1060 a metal layer is deposited on the contact areas defined in stage 1050 so as to enable electrical connection. Preferably the metal layer is deposited directly on the contact areas defined in stage 1050. In stage 1070, a metal layer is deposited on substrate 20 provided in stage 1000 so as to enable electrical connection.

Deposition of the photo absorbing layer of stage 1010, the barrier layer of stage 1030 and the contact layer of stage 1040 may be accomplished by any means known to those skilled in the art including, without limitation molecular beam epitaxy, metal organic chemical vapor deposition, metal organic phase epitaxy or liquid phase epitaxy.

Thus the present embodiment enable a photo-detector sensitive to a target waveband comprising a photo absorbing layer, preferably exhibiting a thickness on the order of the optical absorption length. In an exemplary embodiment the photo absorbing layer is deposited to a thickness of between one and two times the optical absorption length. A contact layer is further provided, and a barrier layer is interposed between the photo absorbing layer and the contact layer. The barrier layer exhibits a thickness sufficient to prevent tunneling of majority carriers from the photo absorbing layer to the contact layer, and a band gap barrier sufficient to block the flow of thermalized majority carriers from the photo absorbing layer to the contact layer. The barrier layer does not block minority carriers.

An infra-red detector in accordance with the principle of the invention can be produced using either an n-doped photo absorbing layer or a p-doped photo absorbing layer, in which the barrier layer is designed to have no offset for minority carriers and a band gap barrier for majority carriers. Current in the detector is thus almost exclusively by minority carriers. In particular, for an n-doped photo absorbing layer the junction between the barrier layer and the absorbing layer is such that there is substantially zero valence band offset, i.e. the band gap difference appears almost exclusively in the conduction band offset. For a p-doped photo absorbing layer the junction between the barrier layer and the absorbing layer is such that there is substantially zero conduction band offset, i.e. the band gap difference appears almost exclusively in the valence band offset.

Advantageously the photo-detector of the subject invention does not exhibit a depletion layer, and thus the dark current is significantly reduced. Furthermore, in an exemplary embodiment passivation is not required as the barrier layer further functions to achieve passivation.

An exemplary application of the disclosed subject matter is the inclusion of an array of photo detectors within a focal plan array, hereafter FPA, which form an integral component of optical imaging devices, including thermal imaging devices. Use of the disclosed subject matter within the FPA enables improved thermal imaging device performance, including but not limited to, weight, duration of operation, power requirements, cost, pixel operability and durability.

FIGS. 5A, 5B, 5C and 5D present hand-held imaging systems, which utilize the existing photo detector technology.

FIGS. 5E and 5F present aviation technology, which utilize the existing photo detector technology, including the Lockheed Sniper Pod and the Northrop Grumman EOTS pod.

FIG. 6 presents a further example of the existing technology, wherein light enters the apparatus through the front lens optic 602, interacts with the apparatus internal electroptic componentary 604, where it is converted from infrared light to an electric signal, which is transmitted and presented on the apparatus' display 606.

FIG. 7 presents in greater detail the essential components of an exemplary integrated dewar cooler system, hereafter IDCS. In one embodiment, light enters the system 700 through the front optic 704, the light than is received by the FPA, which is located on the cold finger of the dewar 702, and is maintained at a cryogenic temperature. In one embodiment of the disclosure, the FPA operates at a temperature of 150K. In other embodiments, the FPA can operate across a temperature spectrum of between 77K and 150K. The IDCS further comprises a micro-cooler 706, which is responsible for the refrigeration of the FPA.

Figure 8:
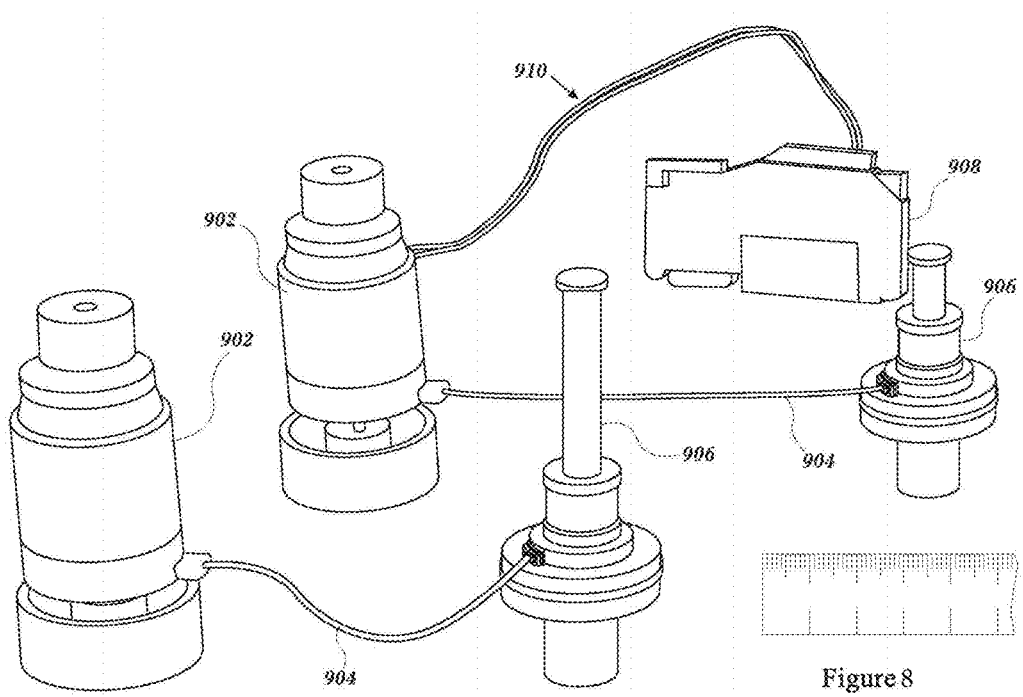
FIG. 8 illustrates an exemplary linear micro cooler (Ricor's K527 split) that is utilized in conjunction with the disclosed subject matter.

FIG. 8 presents an exemplary split linear micro cooler system, comprising a cooler 902 connected via tubing 904 to a cold finger 906, and an external controller 908 connected via wiring 910 to cooler. The exemplary cooler system presented is the Ricor k527 split linear micro cooler. In other embodiment a variety of micro cooler systems can be used.

Figure 9:
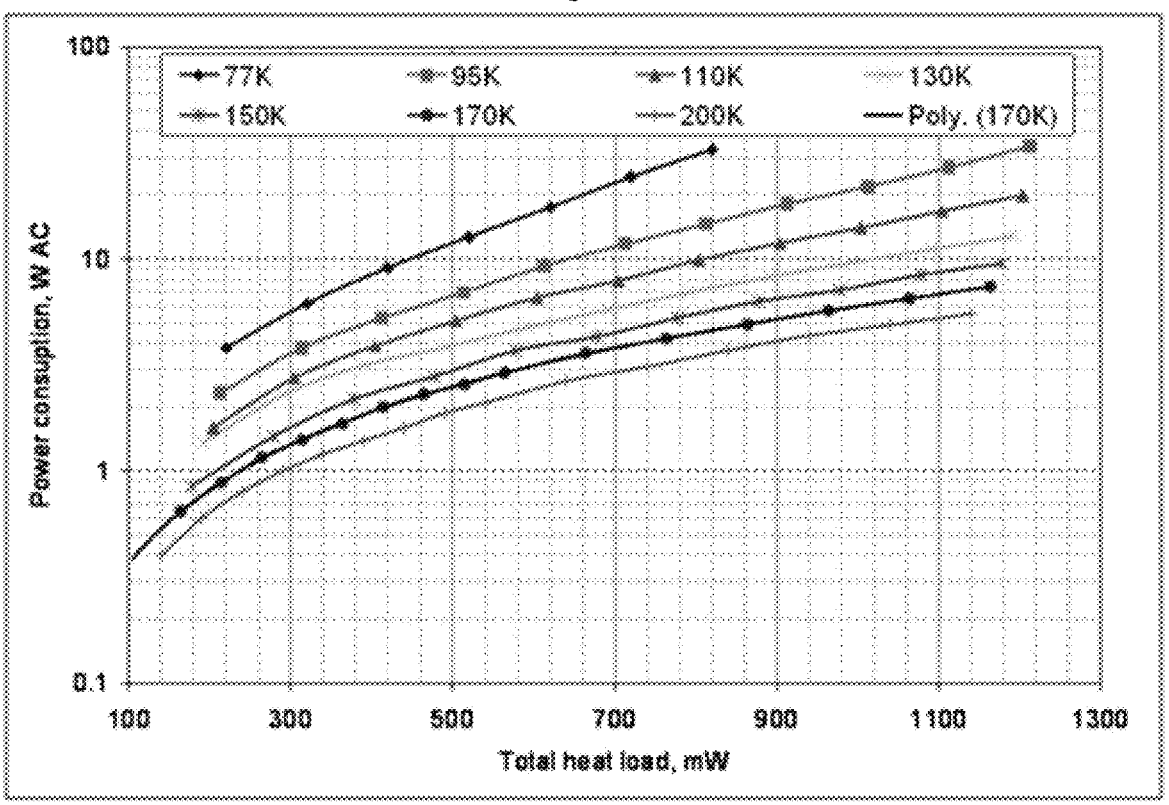
FIG. 9 illustrates resultant improvement in cooling power requirements.

FIG. 9 illustrates the micro-cooler power consumption per heat load across a spectrum of cold finger temperatures.

Figure 10A:
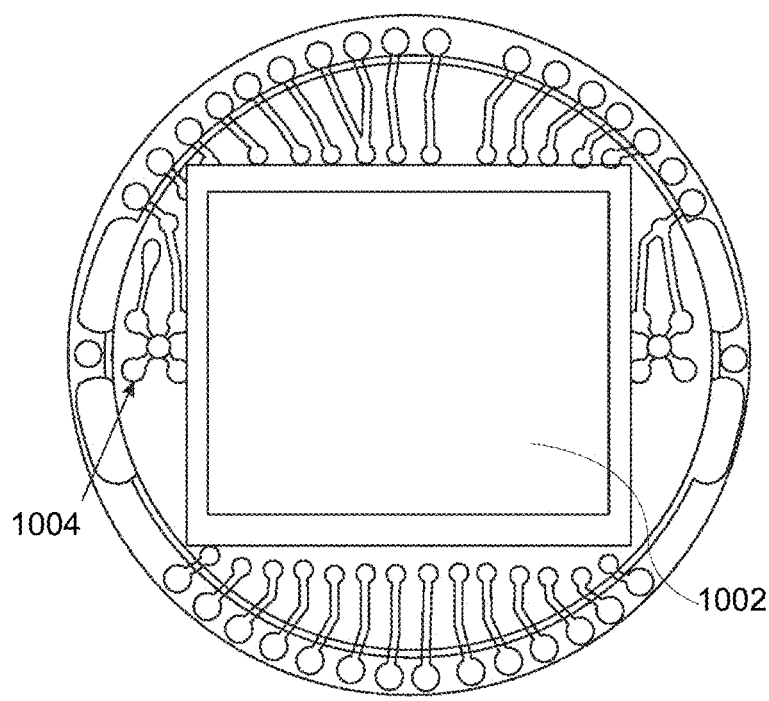
FIG. 10A illustrates a mother board joined to FPA.

FIG. 10A presents the FPA 1002 coupled to a motherboard 1004, which forms a FPA arrangement that can connect to the cold finger.

Figure 10B:
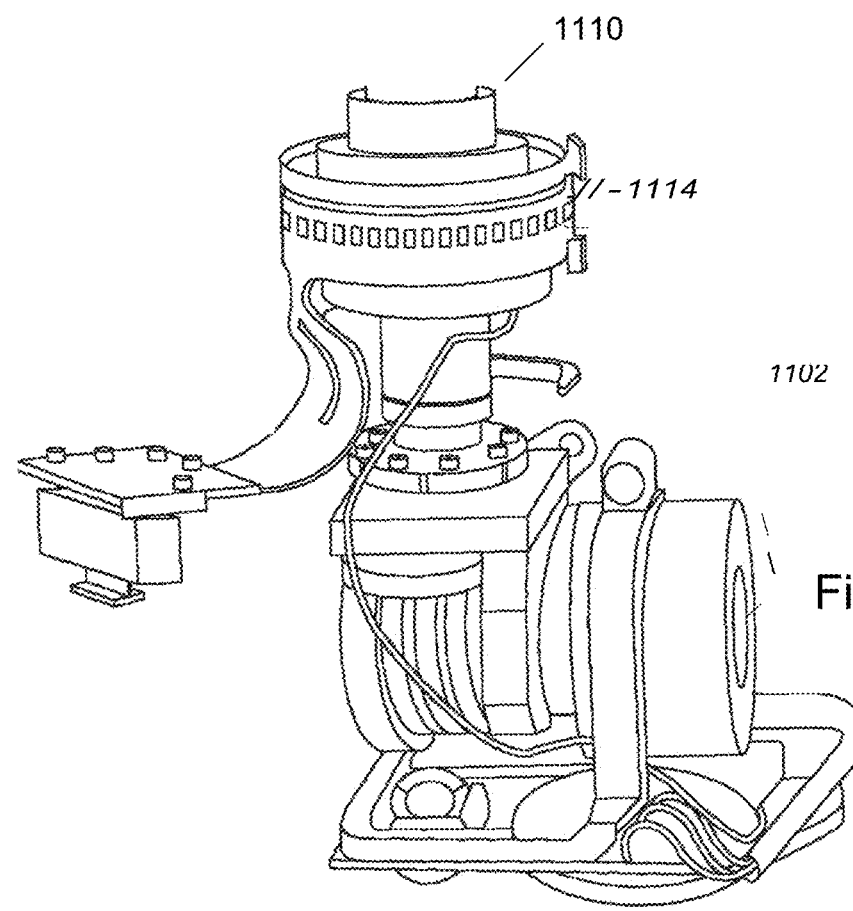
FIG. 10B illustrates a FPA and motherboard located within IDCA arrangement.

FIG. 10B presents an IDCS in greater detail, wherein light enters the dewar 1114 via the optical window 1110, with a micro-cooler 1102 providing refrigeration for the FPA.

FIG. 11 illustrates an exemplary schematic IDCA arrangement. The system operates by allowing light through the front element 1110 which is an optical window located behind a fronting lens, not shown. Light enters through the optical window before interacting with the FPA 1114. The FPA arrangement comprises an array of photo-detectors, coupled to a motherboard. The FPA arrangement is contained within the cold finger of a cryogenic vacuum sealed dewar 1116-1112, which is refrigerated by the micro cooler 1102. The dewar additional comprising: a getter unit 1104; a cold shield 1108 contained within the window envelope 1112, which are positioned on the cold finger 1116. Light interacts with the FPA arrangement, which produces a photo-electronic signal in response. The photo-electronic signal is in turn transmitted from the FPA arrangement via wiring to the feed-through pins 1106.

The IDCA arrangements described heretofore for utilize gas displacement based cryogenics system, such as Stirling cycle systems, pulse tube systems, and the like. Such systems are heavy, relatively complex and expensive. However the low dark current of detectors according to the present invention allow utilization of thermo-electric coolers (TEC hereinafter) utilizing the Peltier effect. TEC's are light relatively inexpensive, and require no moving parts which increase system life time. Certain TEC devices are capable of reaching as low as 150 K and below, which allow practical uses of detectors according to the present invention in many applications such as the applications described herein and extending to other devices as well, such as, by way of non-limiting example, heart beat sensing cameras, firefighters heat sensing cameras, health care systems, and potentially even in cellular telephone devices, as well as other heat sensing applications in the military and commercial applications. It is noted that such weight savings would be highly appreciated in the military field, making heat sensing devices light enough to be carried by the individual soldier, without reducing the soldier's fighting ability. Weight saving is also of extreme importance to the aerospace industry, and this aspect of the present invention extends to light sensing equipment in all those fields, while utilizing photodetectors in accordance with the present invention coupled to a TEC.

FIG. 11A depicts schematically a single stage TEC, and FIG. 11B depicts a multi-stage TEC. FIG. 11C depicts schematically a FPA 1114 in accordance with the present invention, disposed on a TEC 1145. A cold shield 1147 surrounds the FPA so as to prevent spurious radiation from the dewar side walls into the sensor. The TEC 1145, the FPA 1114 and the cold shield 1147 are disposed within a dewar 1149 having an optical window. Notably, due to the relatively high operating temperature, the dewar does not have to be a vacuum dewar, and instead may be filled with inert gas. However a vacuum dewar is also explicitly contemplated.

FIG. 12 presents an flow chart diagram of an exemplary operational process of the disclosed subject matter, comprising: light being generated at source 1202; light entering the apparatus through the front lens element 1204; light interacting with the FPA 1206; the FPA generating a electro message 1208; the electro message being transmitted from the FPA to the IDCA's feeder tubes 1210; the electro message being received by the devices electronics 1214; wherein the device either display the image 1216 or transmits the image to an external display device 1218.

In one embodiment, the optical imaging device containing the IDCA has an interchangeable front lens element. In other embodiment, the front lens element may be fixed, may be fixed and variable, and other arrangements as standard in the art.

In one embodiment of the disclosed subject matter, the IDCA with an array of improved photo detector is accommodated within amateur, professional, or commercial optical devices. In other embodiments, the IDCA is located within military equipment. Aviation examples include precision targeting devices, or Electro Optic Targeting Systems (EOTS).

In yet another embodiment, the IDCA can comprise a plurality of FPA.

Examples of the above disclosure included but is not limited to, incorporation of the claimed IDCA within: Lockheed Sniper Pod Technology; Lockheed EOTS pods; AN/AAQ-37 F-35 Distributed Aperture System (DAS made by Northrop Grumman) and other similar technology; handheld personal cameras; professional cameras; and security optical devices; another example is missile seeker. The disclosed IDCA apparatus could also be incorporated into the existing technologies outlined in the background of the invention.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

It will be appreciated by persons skilled in the art that the present invention is not limited to what has been particularly shown and described hereinabove. Rather the scope of the present invention is defined by the appended claims and includes both combinations and sub-combinations of the various features described hereinabove as well as variations and modifications thereof, which would occur to persons skilled in the art upon reading the foregoing description.

What is claimed is:

1. A photodetector comprising:
a photo absorbing layer comprising a doped semiconductor exhibiting a valence band energy and a conducting band energy during operation of the photo-detector;
a contact layer comprising a p-type doped semiconductor exhibiting a valence band energy and a conducting band energy during operation of the photo-detector;
a barrier layer comprising an undoped semiconductor, the barrier layer having a band energy gap and associated conduction and valence band energies, a first side of the barrier layer adjacent a first side of the photo absorbing layer, and the contact layer being adjacent a second side of the barrier layer opposing the first side, the valence band energy level of the barrier layer substantially equal to the valence band energy level of the photo absorbing layer and the conduction band energy level of the barrier layer exhibiting a significant band gap in relation to the conduction band of the photo absorbing layer;
wherein the relationship between the photo absorbing layer and contact layer valence and conduction band energies and the barrier layer conduction and valance band energies is selected to facilitate minority carrier current flow while inhibiting majority carrier current flow between the contact and photo absorbing layers.

2. A photodetector as claimed in claim 1 wherein the doping impurities introduced into the barrier layer comprise beryllium.

3. A photodetector as claimed in claim 1 wherein the doping impurities introduced into the barrier layer are selected from a group consisting of Carbon, Silicon, Tellurium, and Tin, or any combination thereof.

4. A focal plan array comprising a plurality of photodetectors as claimed in claim 1.

* * * * *